United States Patent
Yoshiyama et al.

(10) Patent No.: US 6,657,247 B2
(45) Date of Patent: Dec. 2, 2003

(54) SEMICONDUCTOR DEVICE WITH MIM CAPACITANCE ELEMENT

(75) Inventors: Kenji Yoshiyama, Hyogo (JP); Kiyoaki Morita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/986,578

(22) Filed: Nov. 9, 2001

(65) Prior Publication Data
US 2002/0179951 A1 Dec. 5, 2002

(30) Foreign Application Priority Data

May 30, 2001 (JP) ........................................ 2001-162122

(51) Int. Cl.[7] ...................... H01L 27/108; H01L 29/76; H01L 29/94; H01L 31/119
(52) U.S. Cl. ........................................ 257/303; 257/306
(58) Field of Search ................................. 257/303, 304, 257/306, 307, 308, 309, 296, 300, 532; 438/239, 253, 254, 255, 393, 396, 397, 398

(56) References Cited

U.S. PATENT DOCUMENTS

| 5,926,359 A | | 7/1999 | Greco et al. |
| 5,972,788 A | * | 10/1999 | Ryan et al. ................. 438/634 |
| 6,180,976 B1 | * | 1/2001 | Roy ............................ 257/306 |
| 6,188,098 B1 | * | 2/2001 | Amanuma ................... 257/306 |
| 6,342,734 B1 | * | 1/2002 | Allman et al. ............... 257/296 |

FOREIGN PATENT DOCUMENTS

| JP | 8-306862 | 11/1996 |
| JP | 2000-101023 | 4/2000 |
| JP | 2000-228497 | 8/2000 |

* cited by examiner

*Primary Examiner*—Wael Fahmy
*Assistant Examiner*—Hoai Pham
(74) *Attorney, Agent, or Firm*—McDermott, Will & Emery

(57) ABSTRACT

A lower metal layer is provided on a lower interlayer insulating film in an MIM capacitance element forming region. The lower metal layer is formed by the same step as that in which the lower interconnection layer is formed. A dielectric layer and an upper metal layer patterned using the same mask are provided on the lower metal layer. The upper metal layer is formed to have a thickness that is thinner than the thickness of the lower metal layer. Thus, it becomes possible to achieve high reliability (lifetime) of the MIM capacitance element by improving the structure of the MIM capacitance element as well as the manufacturing steps.

3 Claims, 22 Drawing Sheets

SEMICONDUCTOR DEVICE WITH MIM CAPACITANCE ELEMENT

BACKGROUND OF THE INVENTION

1. Field of the Invention

The present invention relates to a semiconductor device and a method of producing the same, and more specifically, to a structure of a metal insulator metal (hereinafter referred to as MIM) capacitance element and a method of producing the same.

2. Description of the Background Art

In recent years, in an analog circuit, there is an increasing demand for a large capacity capacitance element with high accuracy. Conventionally, a gate capacitance element and a PIP (Poly Si Insulator Poly Si) capacitance element have been mounted on the analog circuit as the capacitance elements. The structures of these capacitance elements, however, involve problems such as high resistance of an electrode and voltage dependency of a capacitance value due to a change in a thickness of a depletion layer so that they are not suitable for high accuracy capacitance elements. Moreover, when compared to a manufacturing step of a semiconductor device that does not include a PIP capacitance element, the manufacturing step of a semiconductor device with the PIP capacitance element additionally requires a heat treatment step so that the characteristics of a high accuracy transistor and a resistance element are affected, which makes it difficult to control the manufacturing step while taking these characteristics into account.

On the other hand, the MIM capacitance elements disclosed in Japanese Patent Laying-Open Nos. 2000-228497 and 2000-101023 and U.S. Pat. No. 5,926,359 have an upper layer electrode and a lower layer electrode forming a metal structure so that they offer the advantages of lower resistance in the electrode, of no voltage dependency of the capacitance value by a depletion layer, and of not requiring extra heat treatment during the formation of the MIM structure, and so on. Thus, in the analog circuit, the MIM capacitance element is gradually replacing the PIP capacitance element.

In a case where the MIM capacitance element is used in an analog circuit, however, there is a need further to optimize the structure and the manufacturing steps with respect to high reliability (lifetime) of the MIM capacitance element.

SUMMARY OF THE INVENTION

The object of the present invention is to make possible high reliability (lifetime) of an MIM capacitance element in a semiconductor device using the MIM capacitance element by improving the structure of the MIM capacitance element as well as its manufacturing steps.

In order to achieve the above object, according to one aspect of the semiconductor device based on the present invention, the semiconductor device includes a capacitance element formed by stacking a lower metal layer, a dielectric layer, and an upper metal layer; an interconnection layer provided in a prescribed region; a first interconnection line connecting via a first via hole to the lower metal layer; a second interconnection line connecting via a second via hole to the upper metal layer; and a third interconnection line connecting via a third via hole to the interconnection layer, wherein the lower metal layer is made of the same material formed in the same manufacturing step as that of the interconnection layer, and the first interconnection line and the second interconnection line are made of the same material formed in the same manufacturing step as that of the third interconnection line after the first via hole, the second via hole, and the third via hole are formed at the same time.

According to the above-described semiconductor device, since the lower metal layer forming the capacitance element is formed at the same time in the step of manufacturing the interconnection layer, only a step that utilizes one sheet of mask (photolithography step) needs to be added for separating a conductive layer into an interconnection layer and a lower metal layer so that there is no need to provide a separate step for forming the lower metal layer.

In addition, a step of forming the first via hole that passes through the lower metal layer and the second via hole that passes through the upper metal layer takes place at the same time as the conventional step of forming the third via hole that passes through an interconnection layer, and the step of forming the first and second interconnection lines respectively within the first and second via holes takes place at the same time as the step of forming the third interconnection line within the third via hole, so that the present structure can be obtained with ease.

Moreover, according to this invention, a thickness of the upper metal layer is preferably made to be thinner than a thickness of the lower metal layer. Thus, it becomes possible to facilitate the planarization by a CMP (Chemical Mechanical Polishing) technique of a surface of an interlayer insulating film formed on the capacitance element.

In addition, according to this invention, the dielectric layer and the upper metal layer are preferably patterned using the same mask so that they have the same shape.

In addition, according to this invention, the upper metal layer preferably has a first metal layer provided on the dielectric layer and a second metal layer provided on the first metal layer, and an end surface of the first metal layer recedes inwardly from an end surface of the second metal layer. According to this arrangement, the end surface of the first metal layer of the upper metal layer forming the capacitance element is not directly exposed to an etchant utilized during the removal of the dielectric layer so that damage is alleviated in the end portion of the first metal layer, and thus it becomes possible to improve the reliability of the capacitance element due to reduction in the leak in the capacitance element.

Moreover, according to this invention, the end surface of the upper metal layer is preferably covered with a sidewall insulating film. According to this structure, since at least a side surface of the upper metal layer is covered by the sidewall insulating film, it becomes possible to prevent the leak between the lower metal layer and the upper metal layer even when an anti-reflection film or the like is formed on the upper metal layer.

In addition, in order to achieve the above-description object, according to another aspect of the semiconductor device based on the present invention, an arrangement of the semiconductor device is characterized in that a lower interconnection layer is provided below the semiconductor device with an interlayer insulating film disposed therebetween, and that in a region below the upper metal layer forming the capacitance element, no via hole exists in the interlayer insulating film between the lower metal layer and the lower interconnection layer. With this arrangement, the unevenness of the surface of the dielectric layer would no longer be created so that a surface area of the dielectric layer would take a value as designed, and the capacitance of the capacitance element can be stabilized.

Moreover, in order to achieve the above-described object, according to a further aspect of the semiconductor device based on the present invention, an arrangement of the semiconductor device is characterized in that an interlayer insulating film is provided below the semiconductor device, and that no interconnection layer exists in the interlayer insulating film in a region below the upper metal layer forming the capacitance element. With this arrangement, the parasitic capacitance that occurs between interconnection layers can be reduced, and the reliability of the function of the semiconductor device having the capacitance element can be improved.

Moreover, in order to achieve the above-described object, according to a still further aspect of the semiconductor device based on the present invention, an arrangement of the semiconductor device has a first interlayer insulating film provided below the semiconductor device, a second interlayer insulating film provided below the first interlayer insulating film, and a metal interconnection layer provided in a region below the second interlayer insulating film below the capacitance element. With this arrangement, it becomes possible to shield using the metal interconnection layer the influence of the capacitance element upon a device or an interconnection layer provided in the vicinity of the capacitance element and to improve the reliability of the function of the semiconductor device having the capacitance element.

In addition, in order to achieve the above-described object, according to an even further aspect of the semiconductor device based on the present invention, an arrangement of the semiconductor device further includes a dummy capacitance element having a dummy upper metal layer and a dummy lower metal layer that does not contribute to the operation, which is characterized in that the capacitance element and the dummy capacitance element are disposed evenly. With this arrangement, a region of uniform height (capacitance element that actually functions and dummy MIM capacitance element) can be formed within a chip so that it becomes possible uniformly to planarize an interlayer insulating film by the CMP polishing.

Moreover, in order to achieve the above-described object, a method of manufacturing the semiconductor device based on the present invention that includes a capacitance element formed by stacking a lower metal layer, a dielectric layer, and an upper metal layer, an interconnection layer provided in a prescribed region, a first interconnection line connecting via a first via hole to the lower metal layer, a second interconnection line connecting via a second via hole to the upper metal layer, and a third interconnection line connected via a third via hole to the interconnection layer includes a step of forming the lower metal layer in the same manufacturing step as the interconnection layer, and a step of forming the first interconnection line and the second interconnection line in the same manufacturing step as the third interconnection line after the first via hole, the second via hole, and the third via hole are formed at the same time.

According to this manufacturing method, it becomes possible to form the lower metal layer forming the capacitance element at the same time in a step of manufacturing the lower interconnection layer, and only a step that utilizes one sheet of mask (photolithography step) needs to be added for separating a conductive layer into the lower interconnection layer and a lower metal layer so that there is no need to provide a separate step for forming the lower metal layer.

In addition, the step of forming the first via hole that passes through the lower metal layer and the second via hole that passes through the upper metal layer can take place at the same time as the conventional step of forming the third via hole that passes through a lower interconnection layer, and the step of forming the first and second interconnection lines respectively within the first and second via holes can take place at the same time as the step of forming the third interconnection line within the third via hole such that there is no need to provide additional steps for forming the first and second via holes and the first and second interconnection lines.

Moreover, a thickness of the upper metal layer is formed to be thinner than a thickness of the lower metal layer. As a result, it becomes possible to facilitate the planarization by the CMP technique of a surface of an interlayer insulating film.

Further, the dielectric layer and the upper metal layer are preferably patterned using the same mask. As a result, it becomes possible to simplify the manufacturing steps.

Furthermore, the dielectric layer preferably serves a function of an anti-reflection film. Consequently, there is no need to form an anti-reflection film in a succeeding step so that it becomes possible to simplify the manufacturing steps.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor device according to each embodiment and a method of manufacturing the semiconductor device based on the present invention will be described below with reference to the drawings.

First Embodiment

A semiconductor device and a method of manufacturing the semiconductor device according to the first embodiment will be described with reference to FIGS. 1 to 6.

Cross Sectional Structure

Figure 1:
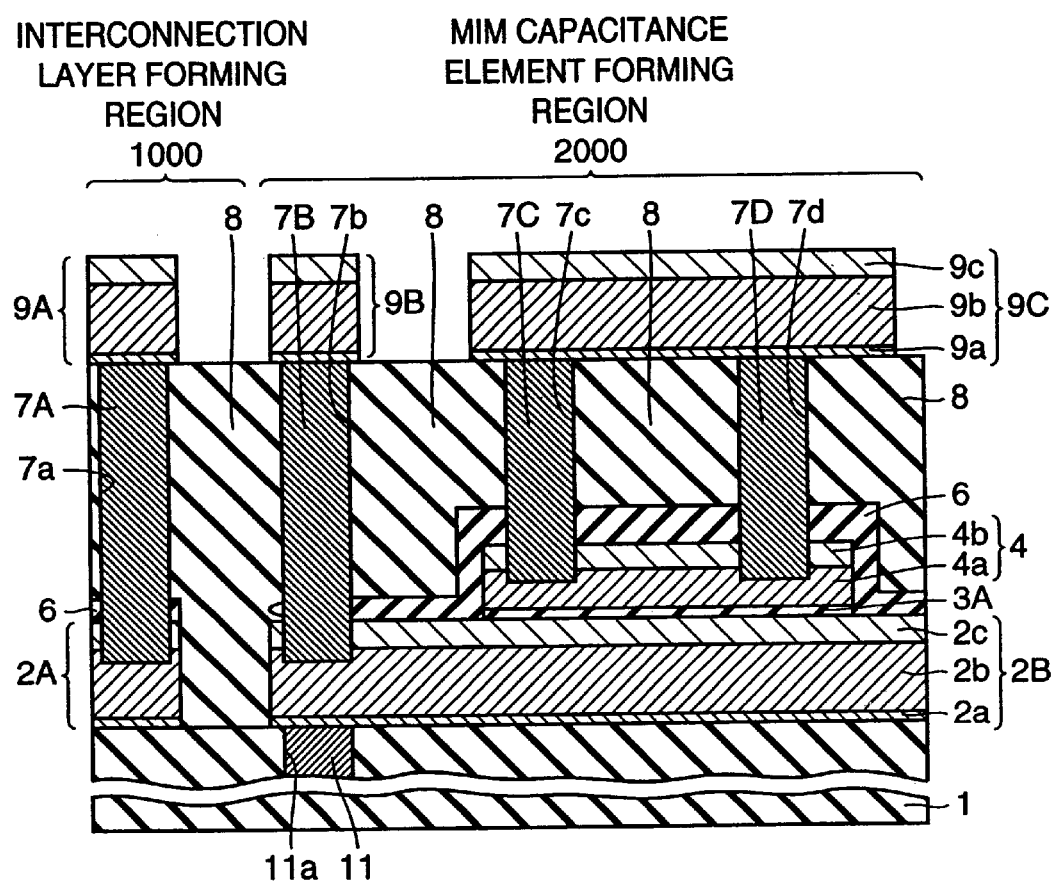
FIG. 1 is a cross sectional view showing a structure of a semiconductor device having an MIM capacitance element according to a first embodiment.

As shown in FIG. 1, the semiconductor device according to the first embodiment includes an interconnection layer forming region 1000 and an MIM capacitance element forming region 2000. A lower interlayer insulating film 1 is provided in both regions of interconnection layer forming region 1000 and MIM capacitance element forming region 2000. An interconnection line 11 is provided within a via hole 11a in MIM capacitance element forming region 2000 of lower interlayer insulating film 1.

A lower interconnection layer 2A is provided on lower interlayer insulating film 1 in interconnection layer forming region 1000. Lower interconnection layer 2A is formed of a TiN layer 2a, AlCu layer 2b, and a TiN/Ti layer 2c. Above lower interconnection layer 2A, an upper interconnection layer 9A is provided with an interlayer insulating film 8 disposed therebetween. Upper interconnection layer 9A, like lower interconnection layer 2A, is formed of a TiN layer 9a, an AlCu layer 9b, and a TiN (top)/Ti (bottom) layer 9c.

Lower interconnection layer 2A and upper interconnection layer 9A are electrically connected by an interconnection line 7A provided within a via hole 7a in interlayer insulating film 8. Moreover, an anti-reflection film 6 made of P—SiON is formed on a surface of lower interconnection layer 2A. Anti-reflection film 6 is to be utilized in a manufacturing step which will be described later on.

A lower metal layer 2B is provided on lower interlayer insulating film 1 in MIM capacitance element forming region 2000. Lower metal layer 2B is produced in the same step as lower interconnection layer 2A so that lower metal layer 2B is formed of TiN layer 2a, AlCu layer 2b, and TiN (top)/Ti (bottom) layer 2c.

On lower metal layer 2B, a dielectric layer 3A made of P-TESO and an upper metal layer 4 are provided which are patterned to have a prescribed shape. Upper metal layer 4 is formed of an AlCu/Ti (100 nm/50 nm) layer 4a and a TiN (top)/Ti (bottom) layer 4b. Anti-reflection film 6 made of P—SiON is provided such that it covers a top surface and side surfaces of upper metal layer 4, side surfaces of dielectric layer 3A, and a surface of lower metal layer 2B being exposed.

Above upper metal layer 4, upper interconnection layers 9B, 9C are provided with interlayer insulating film 8 disposed therebetween. Upper interconnection layers 9B, 9C, like upper interconnection layer 9A described above, are formed of TiN layer 9a, AlCu layer 9b, and TiN (top)/Ti (bottom) layer 9c.

Lower metal layer 2B and upper interconnection layer 9B are electrically connected by an interconnection line 7B provided within a via hole 7b in interlayer insulating film 8. In addition, upper metal layer 4 and upper interconnection layer 9C are electrically connected by interconnection lines 7C, 7D provided within via holes 7c, 7d in interlayer insulating film 8.

Manufacturing Steps

Figure 2:
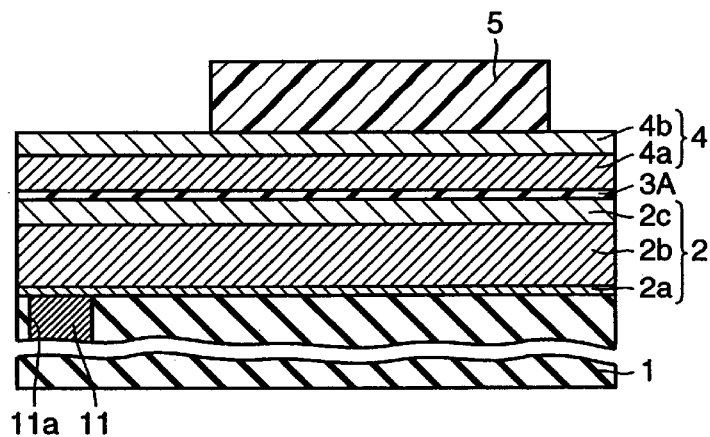
FIGS. 2 to 6 are diagrams representing first to fifth manufacturing steps of a method of manufacturing the semiconductor device according to the cross sectional structure of FIG. 1.

Next, a method of manufacturing the semiconductor device formed with the above-described arrangement will be described with reference to FIGS. 2 to 6. First, as shown in FIG. 2, a conductive layer 2 which forms lower interconnection layer 2A and lower metal layer 2B of the MIM capacitance element is formed on lower interlayer insulating film 1 having interconnection line 11 provided in via hole 11a. As conductive layer 2, TiN layer 2a having a thickness of approximately 50 nm, AlCu layer 2b having a thickness of approximately 300 nm, and TiN/Ti layer 2c having a thickness of approximately 30 nm/2 nm are successively formed. Then, for instance, P-TESO is formed to a thickness of approximately 50 nm as dielectric layer 3A on TiN/Ti layer 2c.

Then, AlCu/Ti (100 nm/50 nm) layer 4a having a thickness of approximately 100 nm and TiN/Ti layer 4b having a thickness of approximately 30 nm/2 nm forming upper metal layer 4 of the MIM capacitance element are formed. The thickness of upper metal layer 4 is formed to be thinner than at least the thickness of conductive layer 2 forming a lower layer electrode 2B so as to facilitate the planarization of interlayer insulating film 8 to be formed later. Then, a resist film 5 having a pattern of a prescribed shape is formed by a photolithography technique in MIM capacitance element forming region 2000.

Figure 3:
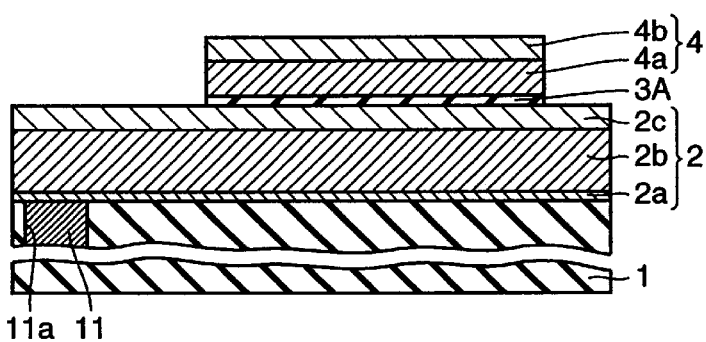

Then, as shown in FIG. 3, dielectric layer 3A and upper metal layer 4 are patterned using a mixed gas of C12 and BC13 with resist film 5 serving as a mask. Thereafter, resist film 5 is removed. In addition, upper metal layer 4 alone may be patterned using resist film 5, and thereafter, resist film 5 may be removed and dielectric layer 3A may be removed by etch back. In this case, for instance, a P-TEOS film may be stacked to a thickness of approximately 50 nm (not shown) as a protective film as the top layer of upper metal layer 4.

Figure 4:
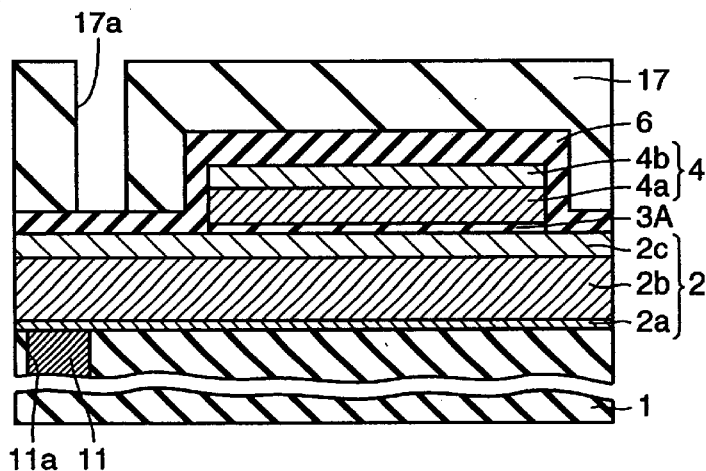
Figure 5:
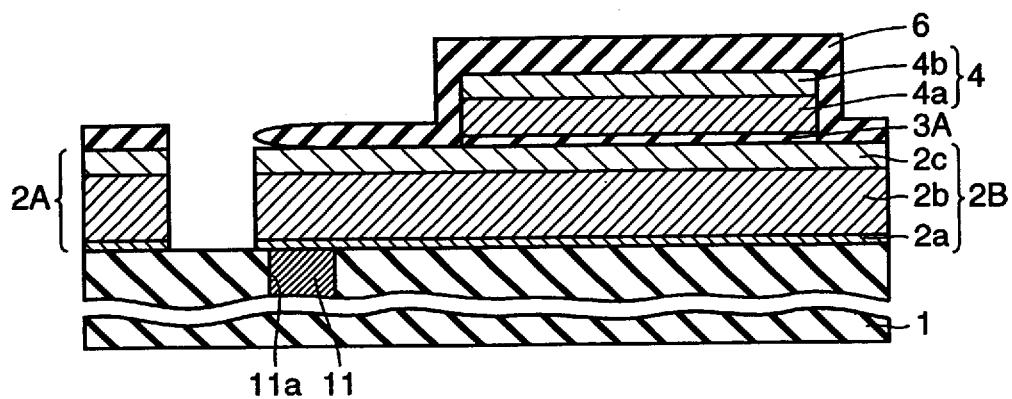

Then, as shown in FIG. 4, anti-reflection film 6 made of P—SiON having a thickness of approximately 50 nm is formed such that it covers a top surface and side surfaces of upper metal layer 4, side surfaces of dielectric layer 3A, and a surface of conductive layer 2 exposed. Then, on anti-reflection film 6, a resist film 17 having a prescribed opening 17a in a boundary region between interconnection layer forming region 1000 and MIM capacitance element forming region 2000 is formed using the photolithography technique. Thereafter, as shown in FIG. 5, anti-reflection film 6 and conductive layer 2 are etched using resist film 17 as a mask. As a result, lower interconnection layer 2A and lower metal layer 2B are formed in interconnection layer forming region 1000. Thereafter, resist film 17 is removed.

Figure 6:
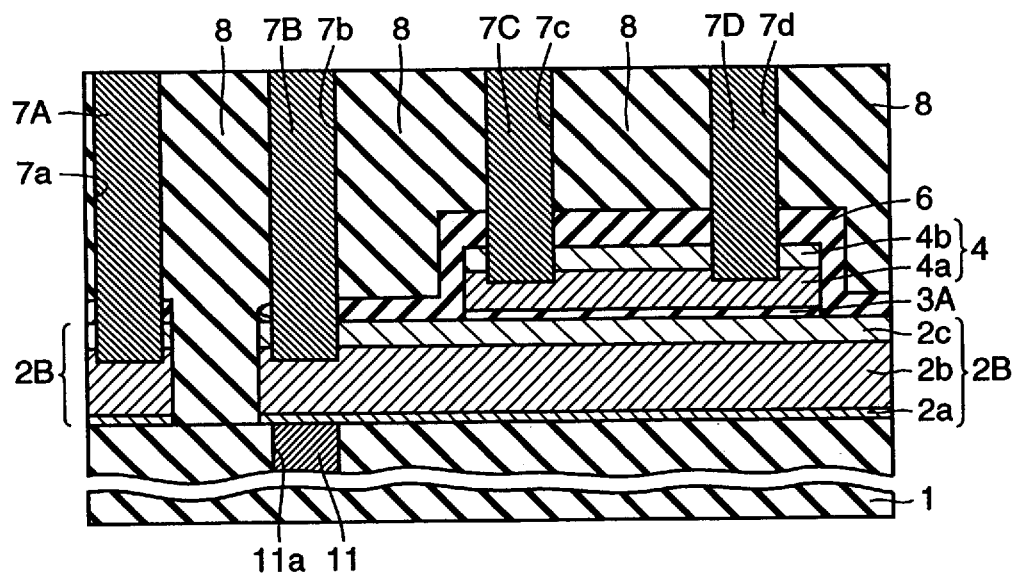

Then, as shown in FIG. 6, interlayer insulating film 8 is formed above and entirely over lower interlayer insulating film 1. Thereafter, via hole 7a that passes through lower interconnection layer 2A, via hole 7b that passes through lower metal layer 2B, and via holes 7c, 7d that pass through upper metal layer 4 are formed at the same time in interlayer insulating film 8, while interconnection lines 7A, 7B, 7C, and 7D are formed at the same time within via holes 7a, 7b, 7c, and 7d, respectively. Then, TiN layer 9a, AlCu layer 9b, and TiN/Ti layer 9c are formed on a top surface of interlayer insulating film 8 and are patterned into a prescribed shape to form upper interconnection layer 9A connected to interconnection line 7A, upper interconnection layer 9B connected to interconnection line 7B, and upper interconnection layer 9C connected to interconnection lines 7C, 7D. As a result, the semiconductor device having the MIM capacitance element according to the first embodiment shown in FIG. 1 is completed. Moreover, upper interconnection layers 9A, 9B, 9C may be interconnection layers made of aluminum.

In the method of manufacturing the semiconductor device described above, the same function and effect can be achieved either by adopting a single layer structure of a nitride-type film or a two-layer structure of an oxide-type film and a nitride-type film for dielectric layer 3. In addition, the same function and effect can be achieved by additionally providing, for instance, a TiN layer as a conducting layer as a bottom layer of upper metal layer 4 of the MIM capacitance element. Moreover, the same effect can be achieved without anti-reflection film 6.

The possible stacked layer structures of upper metal layer 4 and lower metal layer 2B include, besides the stacked layer structure described above, Cu (top)/TaN (bottom) and Cu (top)/Ta/TaN (bottom).

Function and Effect

As described above, according to the semiconductor device and the method of manufacturing the semiconductor device according to the first embodiment, lower metal layer 2B forming the MIM capacitance element can be formed at the same time in the step of manufacturing lower interconnection layer 2A so that, as shown in FIG. 5, only a step that utilizes one sheet of mask (photolithography step) needs to be additionally provided for separating conductive layer 2 into lower interconnection layer 2A and lower metal layer 2B, and there is no need to provide a separate step for forming lower metal layer 2B.

In addition, the step of forming via hole 7b that passes through lower metal layer 2B and via holes 7c, 7d that pass through upper metal layer 4 can take place at the same time as the conventional step of forming via hole 7a that passes through lower interconnection layer 2A, and the step of forming interconnection lines 7B, 7C, 7D respectively within via holes 7b, 7c, 7d can take place at the same time as the step of forming interconnection line 7A within via hole 7a, so that there is no need to provide separate steps for forming via holes 7b, 7c, 7d and interconnection lines 7B, 7C, 7D.

Further, the thickness of upper metal layer 4 is formed to be thinner than the thickness of lower metal layer 2B so that the planarization by the CMP technique of a surface of interlayer insulating film 8 can be facilitated.

Second Embodiment

Now, a semiconductor device and a method of manufacturing the semiconductor device according to the second embodiment will be described with reference to FIGS. 7 to 11.

Cross Sectional Structure

Figure 7:
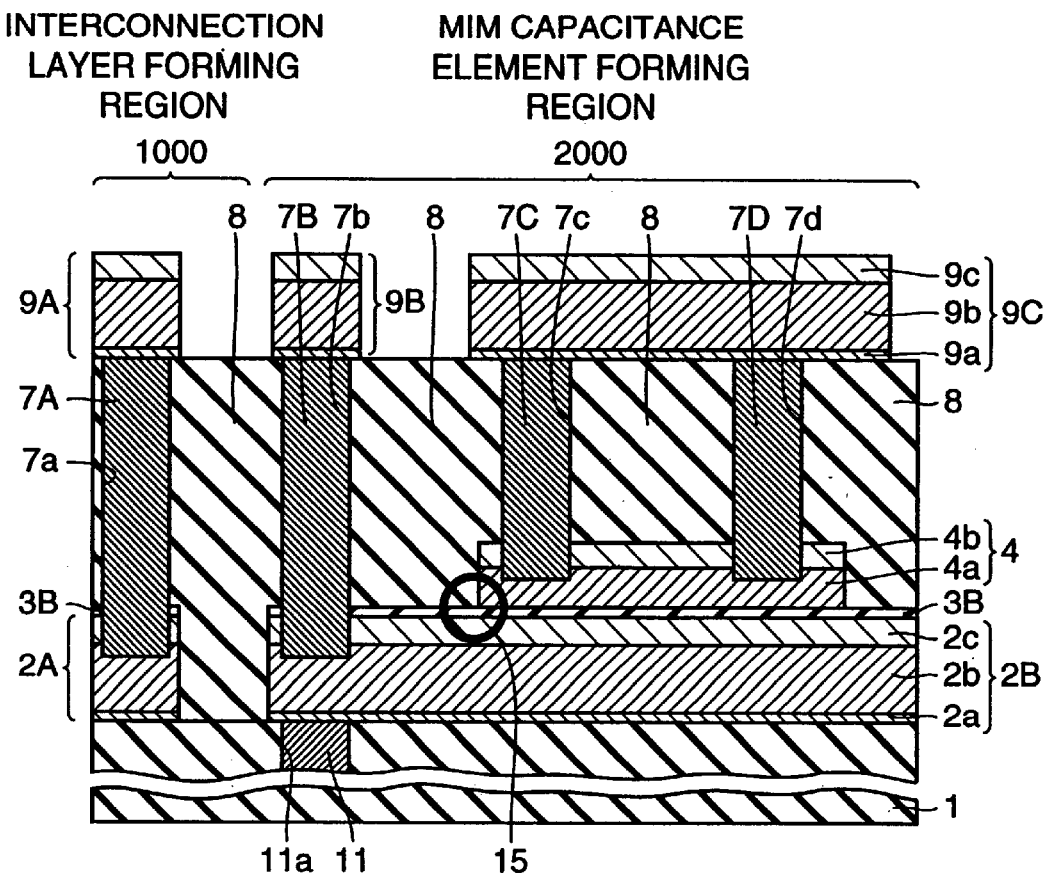
FIG. 7 is a cross sectional view showing a structure of a semiconductor device having an MIM capacitance element according to a second embodiment.

As shown in FIG. 7, as a characteristic of the cross sectional structure of the semiconductor device according to the second embodiment, the cross sectional structure of the semiconductor device according to the second embodiment differs from the structure of the first embodiment in that dielectric layer 3A is patterned in the same shape as upper metal layer 4 in the first embodiment, while dielectric layer 3B is formed so as to cover a surface of lower metal layer 2B in the second embodiment. The structure of the first embodiment is adopted in a case where dielectric layer 3A cannot also function as an anti-reflection film, whereas the structure of the second embodiment can be adopted in a case where dielectric layer 3A can also function as the anti-reflection film. The structure of other portions are the same as the structure in the first embodiment so that the same or corresponding portions are denoted by the same reference characters as the first embodiment, and the detailed description thereof will not be repeated.

Manufacturing Steps

Figure 8:
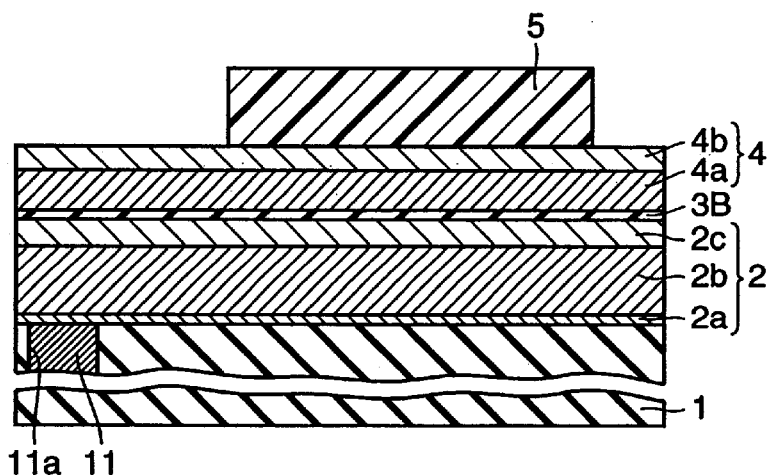
FIGS. 8 to 11 are diagrams representing the first to fourth manufacturing steps of a method of manufacturing the semiconductor device according to the cross sectional structure of FIG. 7.

Now, the method of manufacturing the semiconductor device formed with the above arrangement will be described with reference to FIGS. 8 to 11. First, as shown in FIG. 8, the same manufacturing steps as described in relation to FIG. 2 are performed until resist film 5 of a prescribed shape is formed. Moreover, an TiN (top)/Ti (bottom) layer 2c, P—SiO, P—SiON, P—SiN, $TaO_2$ (tantalum oxide-type) or the like, for instance, is formed to a thickness of approximately 50 nm as a dielectric layer 3B having a function of an anti-reflection film in place of dielectric layer 3A.

Figure 9:
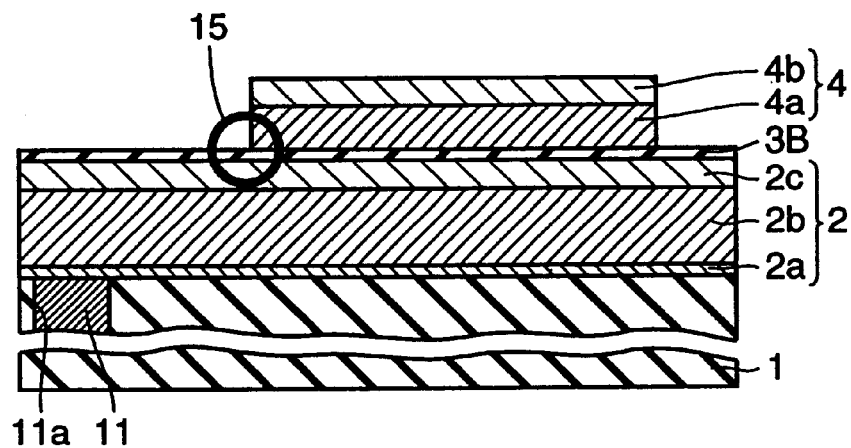

Then, as shown in FIG. 9, upper metal layer 4 alone is patterned using a chlorine-type etchant (C12+BC13) with resist film 5 serving as a mask. Thereafter, resist film 5 is removed.

Figure 10:
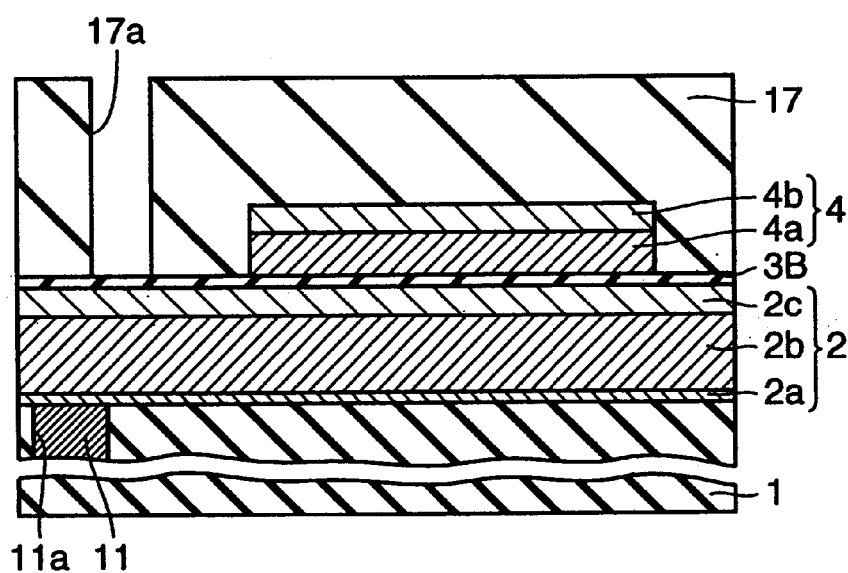

Then, as shown in FIG. 10, as in the step described in relation to FIG. 4, resist film 17 having a prescribed opening 17a in a boundary region between interconnection layer forming region 1000 and MIM capacitance element forming region 2000 is formed using the photolithography technique on dielectric layer 3B and upper metal layer 4. Thereafter, dielectric layer 3B and conductive layer 2 are etched using resist film 17 as a mask. As a result, a lower metal layer 2B is completely formed in interconnection layer forming region 1000.

Figure 11:
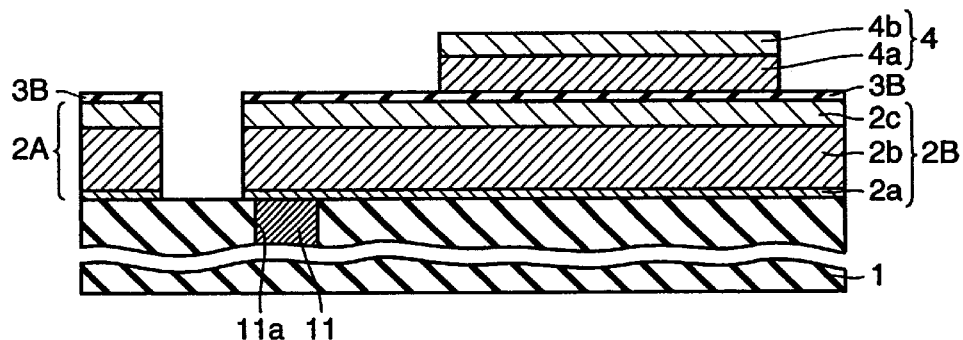

Then, as shown in FIG. 11, after the removal of resist film 17, the same steps as those shown in FIGS. 5 and 6 of the first embodiment are adopted, and the semiconductor device having the MIM capacitance element according to the second embodiment shown in FIG. 7 is completed.

Function and Effect

As described above, according to the semiconductor device and the method of manufacturing the semiconductor device according to the second embodiment, the same function and effect can be achieved as those derived from the semiconductor device and the method of manufacturing the semiconductor device according to the first embodiment. In addition, according to the second embodiment, a step of forming an anti-reflection film can be eliminated from the manufacturing method according to the first embodiment so that the number of manufacturing steps can be reduced.

Moreover, as opposed to the first embodiment, there is no need to pattern dielectric layer 3B so that an end portion of upper metal layer 4 (a region shown by a circle 15 in FIGS.

7 and 9) is not exposed to the etchant used for patterning dielectric layer 3B. Thus, the damage in the end portion of upper metal layer 4 (particularly, damage in AlCu/Ti (100 nm/50 nm) layer 4a) is alleviated, and it becomes possible to improve the reliability of the MIM capacitance element due to reduction in the leak in the MIM capacitance element.

Furthermore, when anti-reflection film 6 is not an insulator with high insulation in the first embodiment, there is a risk of short circuit occurring between upper metal layer 4 and lower metal layer 2B. In the arrangement according to the second embodiment, however, no short circuit would occur between a lower metal layer 2B and upper metal layer 4.

Third Embodiment

Now, a semiconductor device and a method of manufacturing the semiconductor device according to the third embodiment will be described with reference to FIGS. 12 to 16.

Cross Sectional Structure

Figure 12:
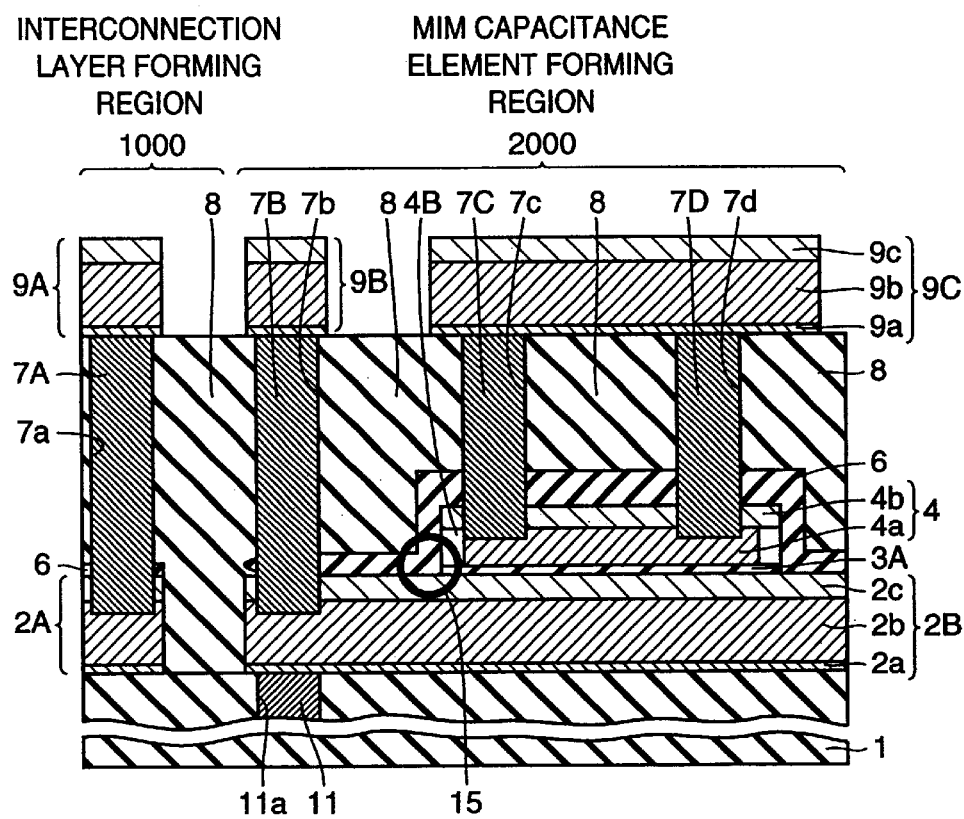
FIG. 12 is a cross sectional view showing a structure of a semiconductor device having an MIM capacitance element according to a third embodiment.

As shown in FIG. 12, a characteristic of the cross sectional structure of the semiconductor device according to the third embodiment is that, when compared with the structure of the first embodiment, while the end surfaces of AlCu/Ti (100 nm/50 nm) layer 4a and TiN (top)/Ti (bottom) layer 4b forming upper metal layer 4 are provided to be located in the same position according to the first embodiment, an end surface of AlCu/Ti (100 nm/50 nm) layer 4a inwardly recedes from an end surface of TiN (top)/Ti (bottom) layer 4b in the third embodiment. Thus, a cavity portion 4B is formed between the end surface of TiN (top)/Ti (bottom) layer 4b and anti-reflection film 6. Moreover, the structure of other portions are the same as the structure of the first embodiment so that the same or corresponding portions are denoted by the same reference characters as the first embodiment, and the detailed description thereof will not be repeated.

Manufacturing Steps

Figure 13:
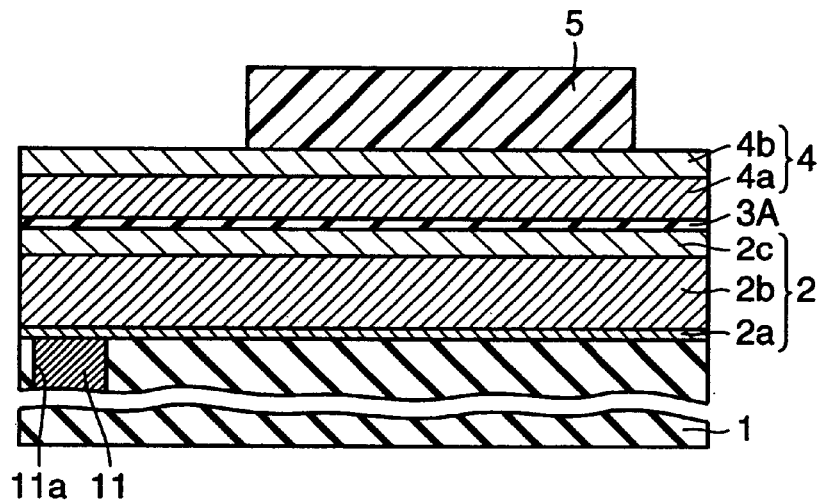
FIGS. 13 to 16 are diagrams representing the first to fourth manufacturing steps of a method of manufacturing the semiconductor device according to the cross sectional structure of FIG. 12.

Now, the method of manufacturing the semiconductor device formed with the above-described arrangement will be described with reference to FIGS. 13 to 16. First, as shown in FIG. 13, the same manufacturing steps as those described in relation to FIG. 2 are performed until resist film 5 of a prescribed shape is formed.

Figure 14:
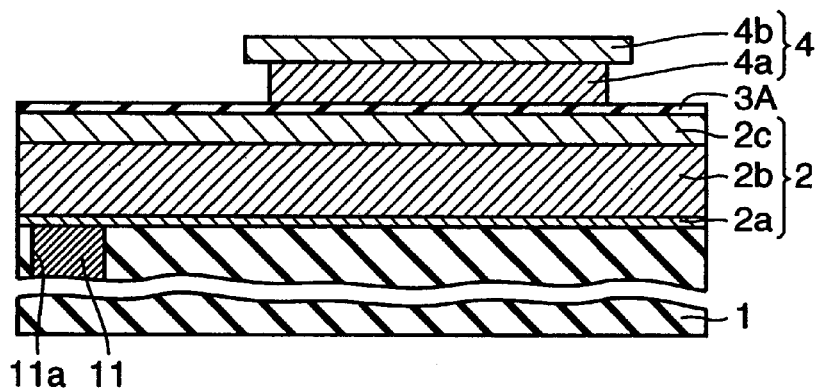

Then, as shown in FIG. 14, upper metal layer 4 alone is patterned using resist film 5 as a mask, and side etch is performed using the stacked films that form upper metal layer 4. In the third embodiment, upper metal layer 4 is formed from the stacked layer structure of AlCu/Ti (100 nm/50 nm) layer 4a and TiN (top)/Ti (bottom) layer 4b so that the etching is performed such that the end surface of AlCu/Ti (100 nm/50 nm) layer 4a recedes from the end surface of TiN (top)/Ti (bottom) layer 4b. Specifically, the etching is performed using a chlorine-type etchant (C12+BC13), for instance, that achieves a faster etch rate with AlCu/Ti (100 nm/50 nm) layer 4a than with TiN (top)/Ti (bottom) layer 4b. Otherwise, as in the first embodiment, the etching of AlCu/Ti (100 nm/50 nm) layer 4a and TiN (top)/Ti (bottom) layer 4b is first performed, and thereafter, wet etching of AlCu/Ti (100 nm/50 nm) layer 4a alone is performed using a phosphoric acid.

Figure 15:
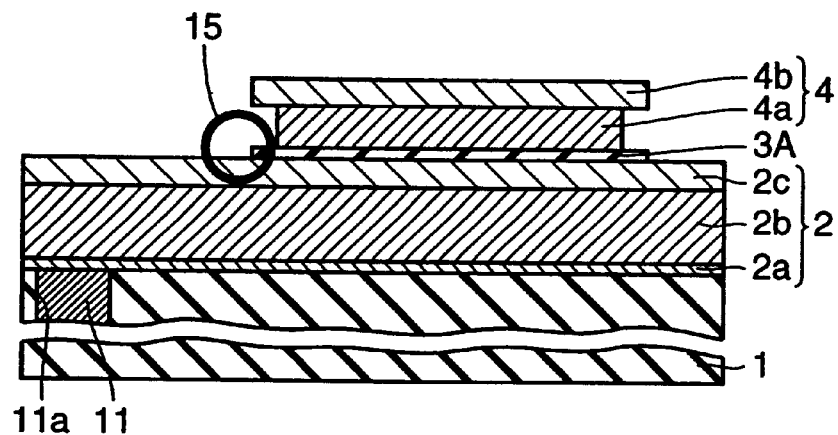
Figure 16:
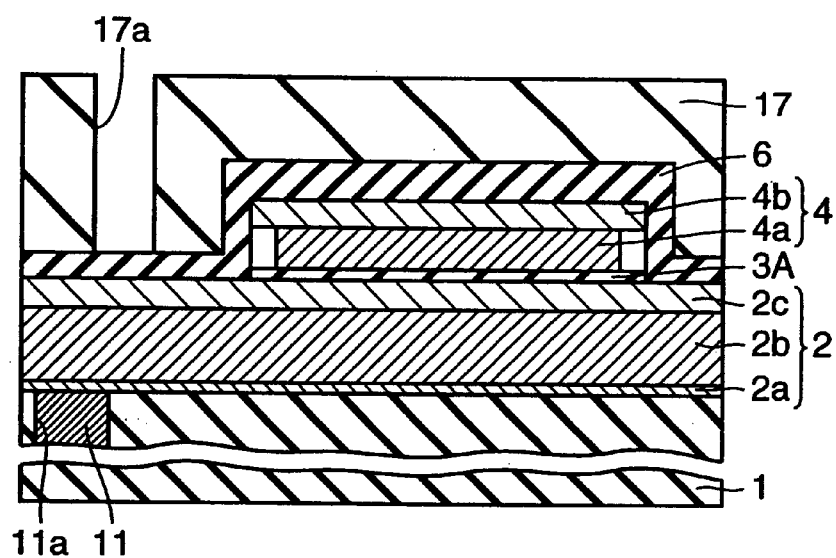

Then, as shown in FIG. 15, dielectric layer 3A is removed by etchback. Thereafter, as shown in FIG. 16, anti-reflection film 6 made of P—SiON having a thickness of approximately 50 nm is formed such that it covers a top surface and side surfaces of upper metal layer 4, side surfaces of dielectric layer 3A, and a surface of conductive layer 2 exposed. Then, on anti-reflection film 6, resist film 17 having a prescribed opening 17a in a boundary region between interconnection layer forming region 1000 and MIM capacitance element forming region 2000 is formed using the photolithography technique. Thereafter, the same steps as those shown in FIGS. 5 and 6 of the first embodiment are employed, and the semiconductor device having the MIM capacitance element according to the third embodiment shown in FIG. 12 is completed.

Function and Effect

As described above, the semiconductor device and the method of manufacturing the semiconductor device according to the third embodiment achieve the same function and effect as those derived from the semiconductor device and the method of manufacturing the semiconductor device according to the first embodiment. In addition, according to the third embodiment, the end surface of AlCu/Ti (100 nm/50 nm) layer 4a of upper metal layer 4 forming the MIM capacitance element is not directly exposed to the etchant used for the removal of dielectric layer 3A so that the damage in an end portion of upper metal layer 4 (particularly, damage in a region indicated by a circle 15 in FIGS. 12 and 15) is alleviated, and it becomes possible to improve the reliability of the MIM capacitance element due to reduction in the leak in the MIM capacitance element. Since the end surface of TiN (top)/Ti (bottom) layer 4b protrudes outward from the end surface of AlCu/Ti (100 nm/50 nm) layer 4a, however, caution is required to prevent the generation of dust particles due to the detachment and such of the protruded portion of Ti (bottom) layer 4b.

Fourth Embodiment

Now, a semiconductor device and a method of manufacturing the semiconductor device according to the fourth embodiment will be described with reference to FIGS. 17 to 19.

Cross Sectional Structure

Figure 17:
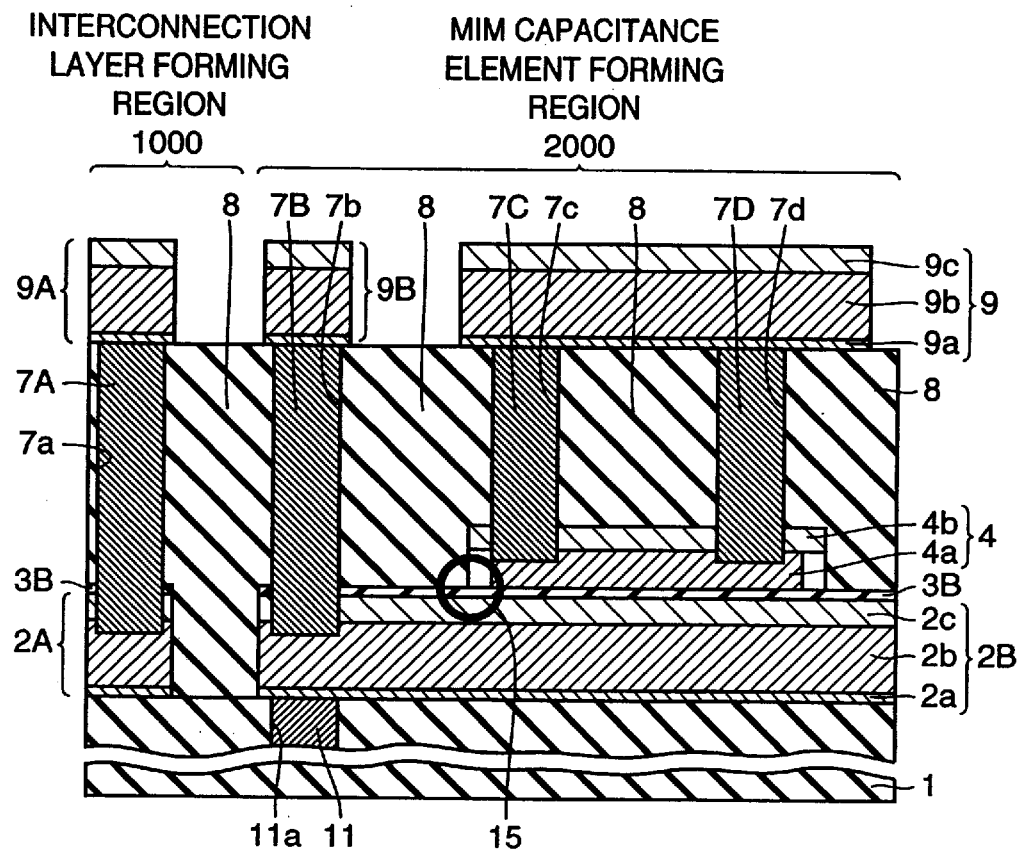
FIG. 17 is a cross sectional view showing a structure of a semiconductor device having an MIM capacitance element according to a fourth embodiment.
Figure 18:
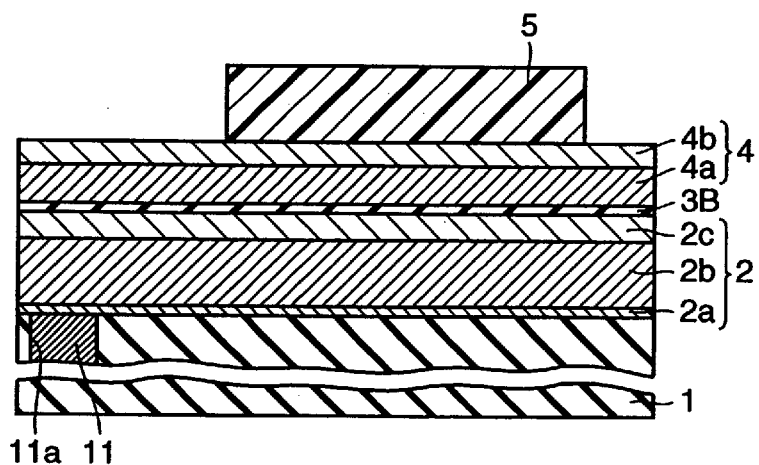
FIGS. 18 and 19 are diagrams representing the first and second manufacturing steps of a method of manufacturing the semiconductor device according to the cross sectional structure of FIG. 17.

As shown in FIG. 17, as a characteristic of the cross sectional structure of the semiconductor device according to the fourth embodiment, the cross sectional structure of the semiconductor device according to the fourth embodiment differs from the structure of the third embodiment in that, while dielectric layer 3A is patterned into the same shape as TiN (top)/Ti (bottom) layer 4b in the third embodiment, dielectric layer 3B is formed such that it covers a surface of lower metal layer 2B in the fourth embodiment. The structure of the third embodiment, like the structure of the first embodiment, is adopted in the case where dielectric layer 3A cannot also function as an anti-reflection film, whereas the structure of the fourth embodiment, like the structure of the second embodiment, can be adopted in the case where dielectric layer 3B can also be made to function as the anti-reflection film. Moreover, the structure in other portions is the same as that of the third embodiment so that the same or corresponding portions are denoted by the same reference characters as the third embodiment, and the detailed description thereof will not be repeated.

Manufacturing Steps

Now, the method of manufacturing the semiconductor device formed with the above arrangement will be described with reference to FIGS. 18 and 19. First, as shown in FIG. 18, the same manufacturing steps as those described in relation to FIG. 2 are performed until resist film 5 of a prescribed shape is formed. In addition, on TiN (top)/Ti (bottom) layer 2c, for instance, P—SiO, P—SiON, P—SiN, TaO$_2$ (tantalum oxide-type) or the like is formed to a thickness of approximately 50 nm as dielectric layer 3B having a function of an anti-reflection film in place of dielectric layer 3A.

Figure 19:
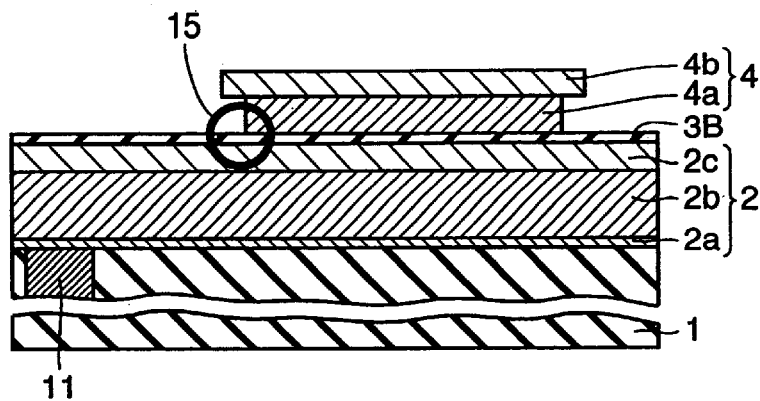

Then, as shown in FIG. 19, upper metal layer 4 alone is patterned using resist film 5 as a mask, and side etch is performed using the stacked films forming upper metal layer 4. In the fourth embodiment, like the third embodiment, upper metal layer 4 is formed by a stacked layer structure of AlCu/Ti (100 nm/50 nm) layer 4a and TiN (top)/Ti (bottom) layer 4b so that the etching is performed in such a manner that an end surface of AlCu/Ti (100 nm/50 nm) layer 4a recedes from an end surface of TiN (top)/Ti (bottom) layer 4b. Specifically, the etching is performed using a chlorine-type etchant (C12+BC13), for instance, which achieves a faster etch rate with AlCu/Ti (100 nm/50 nm) layer 4a than with TiN (top)/Ti (bottom) layer 4b. Otherwise, like the first embodiment, the etching of AlCu/Ti (100 nm/50 nm) layer 4a and TiN (top)/Ti (bottom) layer 4b is first performed, and thereafter, wet etching of AlCu/Ti (100 nm/50 nm) layer 4a alone is performed with a phosphoric acid.

Thereafter, the same steps as those shown in FIGS. 10, 11, 5, and 6 are adopted, and the semiconductor device having the MIM capacitance element according to the fourth embodiment shown in FIG. 17 is completed. In addition, in the fourth embodiment, the end surface of TiN (top)/Ti (bottom) layer 4b protrudes outward from the end surface of AlCu/Ti (100 nm/50 nm) layer 4a so that caution is required to prevent the generation of dust particles due to detachment and such of the protruded portion of Ti (bottom) layer 4b.

Function and Effect

As described above, the semiconductor device and the method of manufacturing the semiconductor device according to the fourth embodiment achieve the same function and effect obtained by the semiconductor device and the method of manufacturing the semiconductor device according to the third embodiment. In addition, according to the fourth embodiment, a step of forming an anti-reflection film can be eliminated from the manufacturing method according to the third embodiment so that the number of manufacturing steps can be reduced.

Moreover, as opposed to the third embodiment, there is no need to pattern dielectric layer 3b, so that an end portion of upper metal layer 4 (a region indicated by a circle 15 in FIGS. 17 and 19) would not be exposed to an etchant used for the patterning of the dielectric layer. Thus, the damage in the end portion of upper metal layer 4 (particularly, damage in AlCu/Ti (100 nm/50 nm) layer 4a) is alleviated, and it becomes possible to improve the reliability of the MIM capacitance element due to reduction in the leak in the MIM capacitance element.

In addition, while there is a risk of short circuit occurring between upper metal layer 4 and lower metal layer 2B when anti-reflection film 6 is not an insulator with high insulation in the third embodiment, no short circuit between lower metal layer 2B and upper metal layer 4 occurs in the arrangement according to the fourth embodiment.

Fifth Embodiment

Now, a semiconductor device and a method of manufacturing the semiconductor device according to the fifth embodiment will be described with reference to FIGS. 20 to 25.

Cross Sectional Structure

Figure 20:
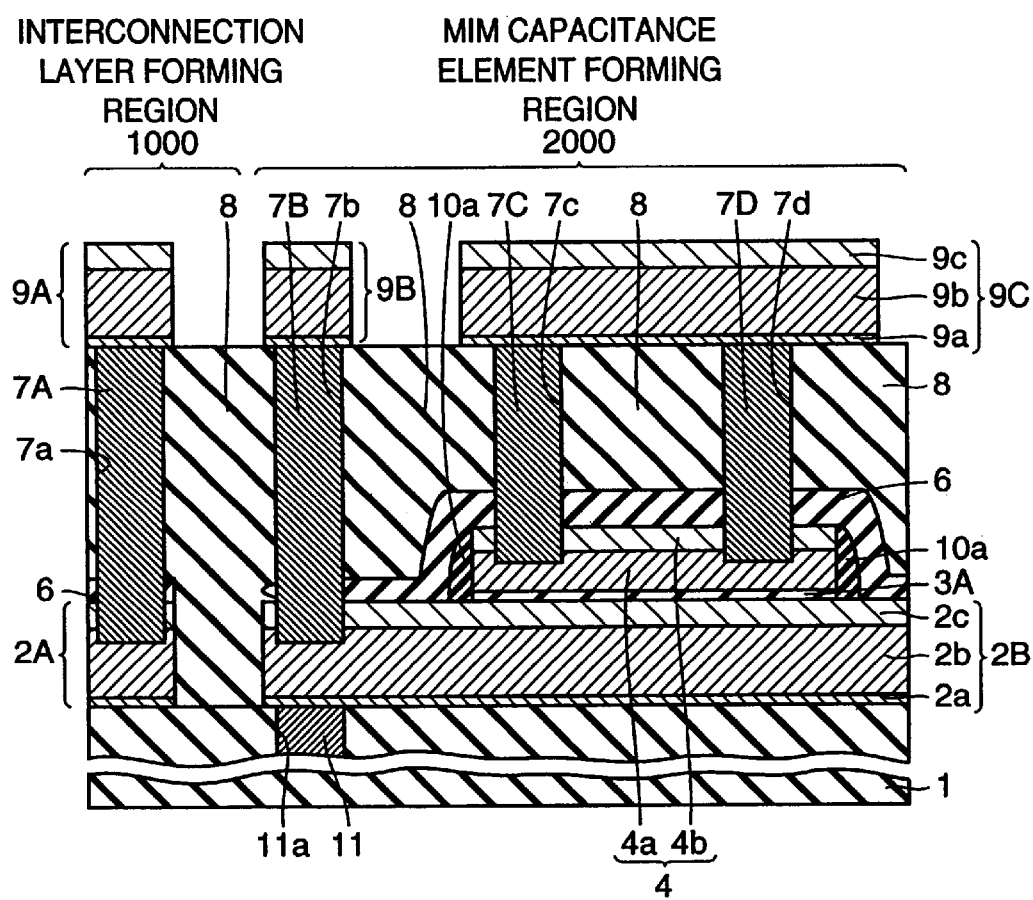
FIG. 20 is a cross sectional view showing a structure of a semiconductor device having an MIM capacitance element according to a fifth embodiment.

As shown in FIG. 20, the characteristic of the cross sectional structure of the semiconductor device according to the fifth embodiment, when compared with the structure of the first embodiment, is that sidewalls 10a are provided on side surfaces of dielectric layer 3A and upper metal layer 4. Moreover, the structure in other portions are the same as that in the first embodiment so that the same or corresponding portions are denoted by the same reference characters as the first embodiment, and the detailed description thereof will not be repeated.

Manufacturing Steps

Figure 21:
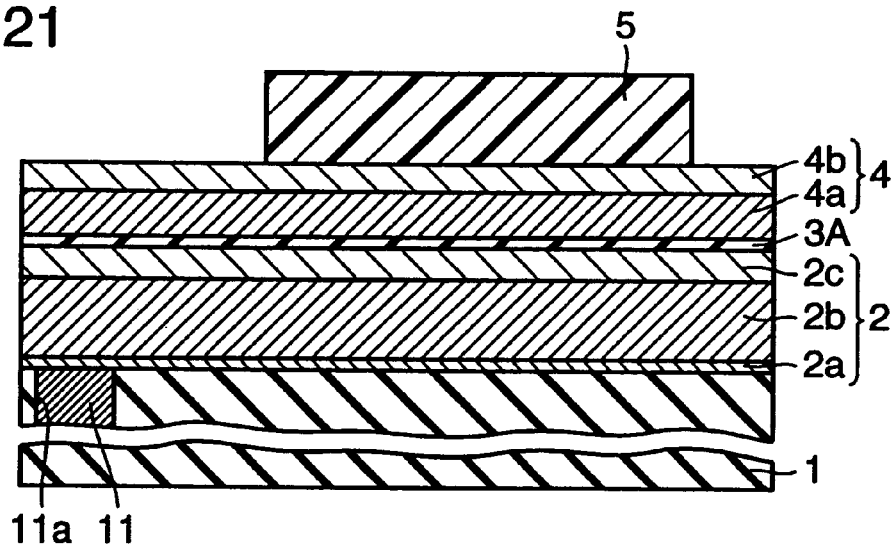
FIGS. 21 to 25 are diagrams representing the first to fifth manufacturing steps of a method of manufacturing the semiconductor device according to the cross sectional structure of FIG. 20.

Now, the method of manufacturing the semiconductor device formed with the above-described arrangement will be described with reference to FIGS. 21 to 25. First, as shown in FIG. 21, the same manufacturing steps as those explained in relation to FIG. 2 are performed until resist film 5 of a prescribed shape is formed.

Figure 22:
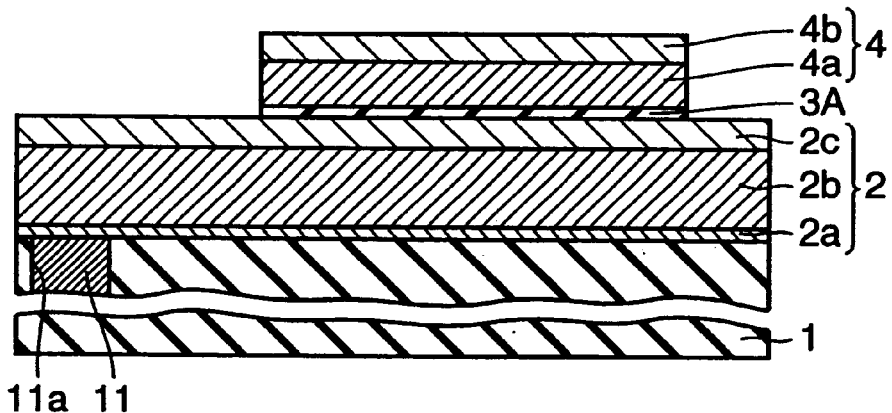
Figure 23:
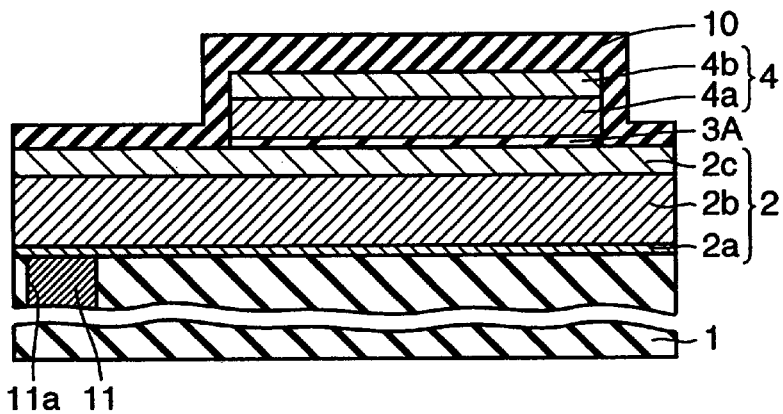

Then, as shown in FIG. 22, like the manufacturing step described in relation to FIG. 3, dielectric layer 3A and upper metal layer 4 are patterned using a mixed gas of C12 and BC13 with resist film 5 serving as a mask. Thereafter, resist film 5 is removed. Then, as shown in FIG. 23, a P-TEOS film 10, for instance, is formed to a thickness of approximately 50 nm as an insulating film such that it covers a top surface and side surfaces of upper metal layer 4, side surfaces of dielectric layer 3A, and a surface of conductive layer 2 exposed.

Figure 24:
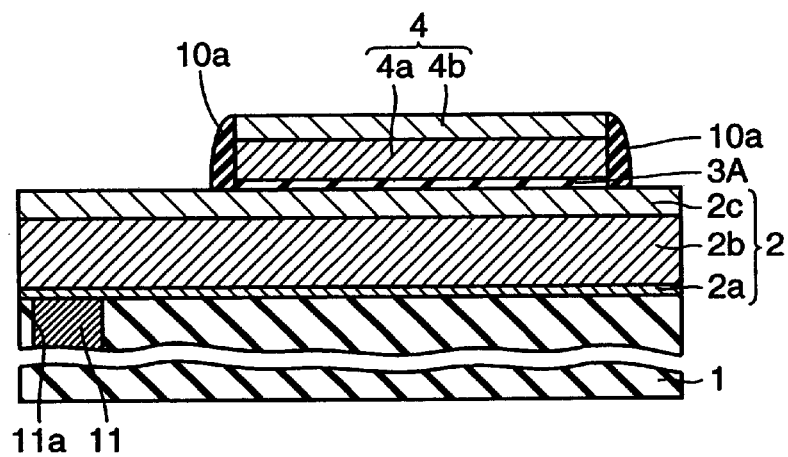
Figure 25:
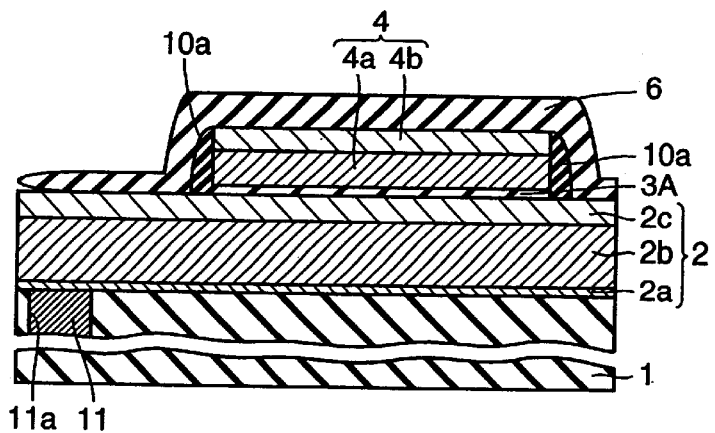

Then, as shown in FIG. 24, P-TEOS film 10 is etched back until conductive layer 2 is exposed so as to form sidewalls 10a made of P—TEOS film on side surfaces of dielectric layer 3A and upper metal layer 4. Thereafter, as shown in FIG. 25, anti-reflection film 6 made of P—SiON having a thickness of approximately 50 nm is formed such that it covers the top surface of upper metal layer 4, sidewalls 10a, and a surface of conductive layer 2 exposed. Thereafter, the manufacturing steps described in relation to FIGS. 4 to 6 of the first embodiment are employed, and the semiconductor device having the MIM capacitance element according to the fifth embodiment shown in FIG. 20 is completed.

Function and Effect

As described above, the semiconductor device and the method of manufacturing the semiconductor device according to the fifth embodiment achieve the same function and effect as those obtained by the semiconductor device and the method of manufacturing the semiconductor device according to the first embodiment. In addition, according to the structure of the first embodiment, since a side surface of upper metal layer 4 that became rough when dielectric layer 3A was removed is in direct contact with anti-reflection film 6, the concentration of electric field can readily occur between a side surface of upper metal layer 4 and anti-reflection film 6 so that the leak easily occurs as a result. According to the structure of the semiconductor device according to the fifth embodiment, however, sidewalls 10a are provided on side surfaces of dielectric layer 3A and upper metal layer 4 so that prevention of the leak between lower metal layer 2B and upper metal layer 4 becomes possible.

Sixth Embodiment

Now, a semiconductor device and a method of manufacturing the semiconductor device according to the sixth embodiment will be described with reference to FIGS. 26 to 30.

Cross Sectional Structure

Figure 26:
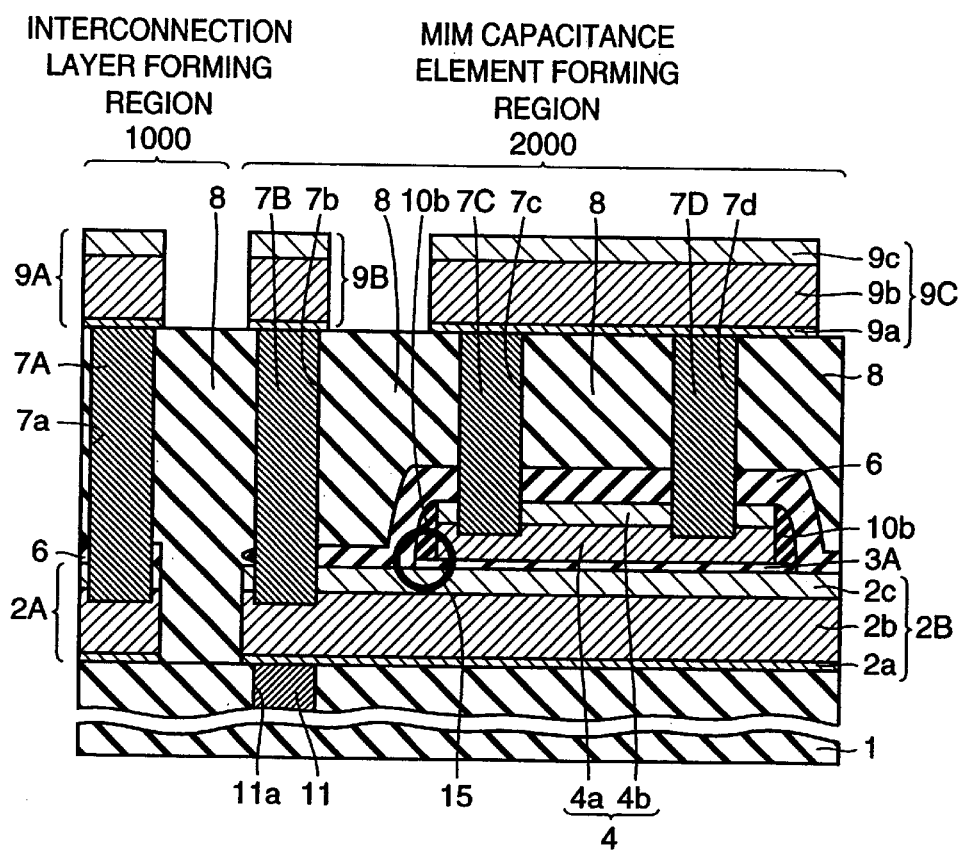
FIG. 26 is a cross sectional view showing a structure of a semiconductor device having an MIM capacitance element according to a sixth embodiment.

As shown in FIG. 26, the characteristic of the cross sectional structure of the semiconductor device according to the sixth embodiment, when compared with the structure of the fifth embodiment, is that sidewalls 10b are provided only on the side surfaces of upper metal layer 4, and that dielectric layer 3A is formed extending below sidewalls 10b. Moreover, the structure in other portions are the same as that in the fifth embodiment so that the same or corresponding portions are denoted by the same reference characters as the fifth embodiment, and the detailed description thereof will not be repeated.

Manufacturing Steps

Figure 27:
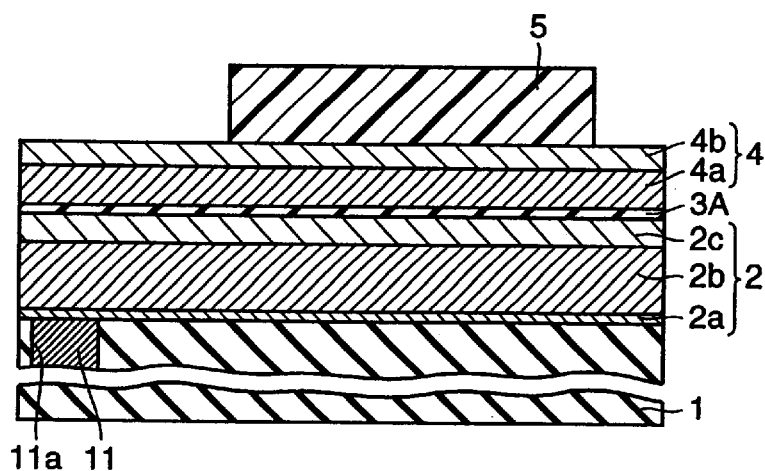
FIGS. 27 to 30 are diagrams representing the first to fourth manufacturing steps of a method of manufacturing the semiconductor device according to the cross sectional structure of FIG. 26.

Now, the method of manufacturing the semiconductor device formed with the above arrangement will be described with reference to FIGS. 27 to 30. First, as shown in FIG. 27, the same manufacturing steps as those described in relation to FIG. 2 are performed until resist film 5 of a prescribed shape is formed.

Figure 28:
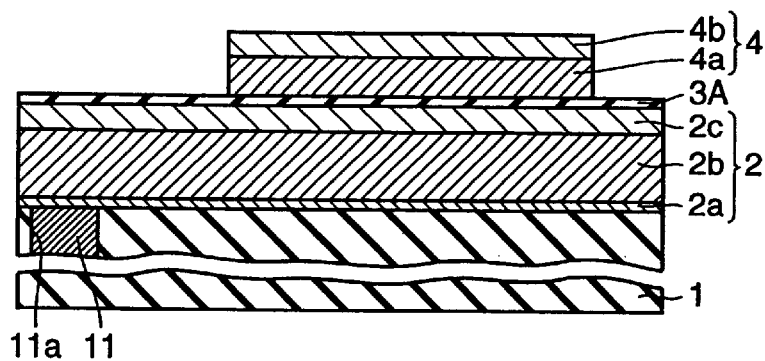

Then, as shown in FIG. 28, like the manufacturing step described in relation to FIG. 9, upper metal layer 4 alone is patterned using a chlorine-type etchant (C12+BC13) with resist film 5 serving as a mask. Thereafter, resist film 5 is removed.

Figure 29:
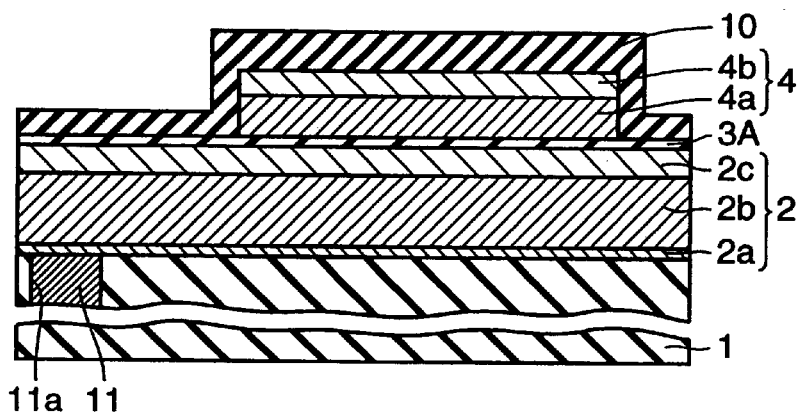

Then, as shown in FIG. 29, for instance, P-TEOS film 10 is formed to a thickness of approximately 50 nm as an insulating film such that it covers a top surface and side surfaces of upper metal layer 4, and a surface of dielectric layer 3A exposed.

Figure 30:
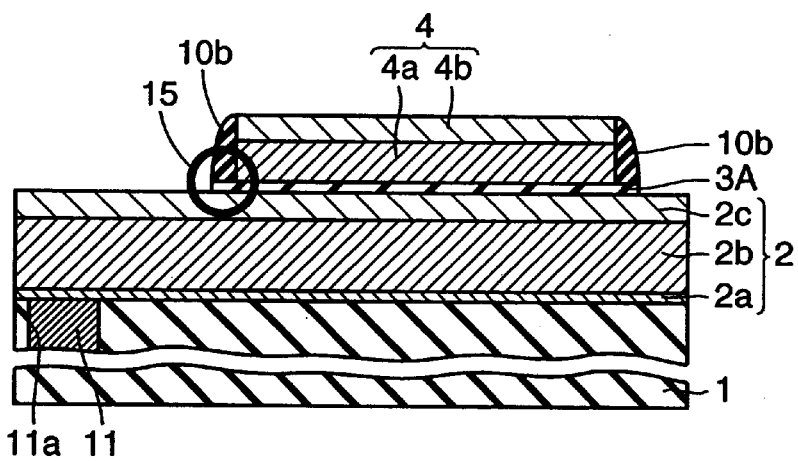

Then, as shown in FIG. 30, exposed dielectric layer 3A and P-TEOS film 10 are etched back until conductive layer 2 is exposed, and sidewalls 10b made of P-TEOS film are formed only on the side surfaces of upper metal layer 4. Thereafter, the manufacturing steps described in relation to FIGS. 4 to 6 of the first embodiment are employed, and the semiconductor device having the MIM capacitance element according to the sixth embodiment shown in FIG. 26 is completed.

Function and Effect

As described above, the semiconductor device and the method of manufacturing the semiconductor device according to the sixth embodiment achieve the same function and effect as those obtained by the semiconductor device and the method of manufacturing the semiconductor device according to the fifth embodiment. In addition, according to the sixth embodiment, a process is adopted in which sidewalls 10b are provided only on the side surfaces of upper metal layer 4 so that an end portion of upper metal layer 4 (a region indicated by a circle 15 in FIGS. 26 and 30) is not exposed to an etchant used for patterning dielectric layer 3A. Thus, the damage in the end portion of upper metal layer 4 (particularly, damage in AlCu/Ti (100 nm/50 nm) layer 4a) is alleviated, and it becomes possible to improve the reliability of the MIM capacitance element due to reduction in the leak in the MIM capacitance element.

Seventh Embodiment

Now, a semiconductor device and a method of manufacturing the semiconductor device according to the seventh embodiment will be described with reference to FIGS. 31 and 32.

Cross Sectional Structure

Figure 31:
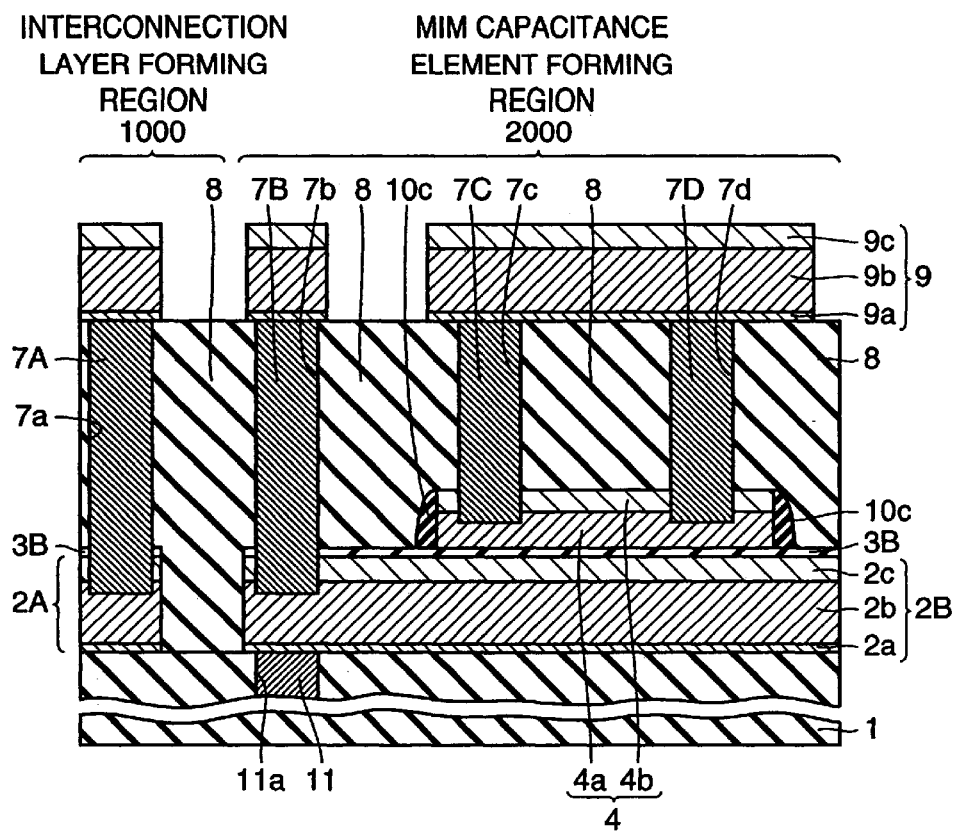
FIG. 31 is a cross sectional view showing a structure of a semiconductor device having an MIM capacitance element according to a seventh embodiment.
Figure 32:
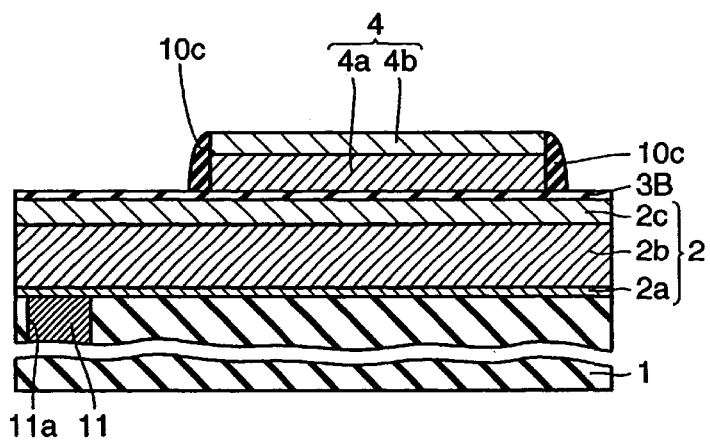
FIG. 32 is a diagram representing a manufacturing step of a method of manufacturing the semiconductor device according to the cross sectional structure of FIG. 31.

As shown in FIG. 31, the characteristic of the cross sectional structure of the semiconductor device according to the seventh embodiment, when compared with the structures of the semiconductor devices according to the fifth and sixth embodiments, is that dielectric layer 3B is formed such that it covers a surface of lower metal layer 2B. The structures of the fifth and sixth embodiments are adopted when dielectric layer 3A cannot also be made to function as an anti-reflection film, whereas the structure according to the seventh embodiment can be adopted when dielectric layer 3B can also be made to function as the anti-reflection film. Moreover, sidewalls 10c are provided only on side surfaces of upper metal layer 4. In addition, the structure in other portions are the same as that according to the fifth and sixth embodiments so that the same or corresponding portions are denoted by the same reference characters as those in the fifth and sixth embodiments, and the detailed description thereof will not be repeated.

Manufacturing Steps

Now, the method of manufacturing the semiconductor device formed with the above arrangement will be described. As shown in FIG. 32, in the steps shown in FIGS. 27 to 29 described above, instead of forming dielectric layer 3A, for instance, P—SiO, P—SiON, P—SiN, $TaO_2$ (tantalum oxide-type) or the like is formed to a thickness of approximately 50 nm as dielectric layer 3B having a function of an anti-reflection film on TiN (top)/Ti (bottom) layer 2c. Thereafter, P-TEOS film 10 is etched back until dielectric layer 3B is exposed, and sidewall 10c made of P-TEOS film are formed only on the side surfaces of upper metal layer 4. Thereafter, the manufacturing steps described in relation to FIGS. 4 to 6 of the first embodiment are employed, and the semiconductor device having the MIM capacitance element according to the seventh embodiment shown in FIG. 31 is completed.

Function and Effect

As described above, the semiconductor device and the method of manufacturing the semiconductor device according to the seventh embodiment achieve the same function and effect as those obtained by the semiconductor device and the method of manufacturing the semiconductor device according to the sixth embodiment. In addition, according to the seventh embodiment, a step of forming an anti-reflection film can be eliminated from the manufacturing method according to the sixth embodiment so that the number of manufacturing steps can be reduced.

Eight Embodiment

Now, a layout of the semiconductor device according to each of the embodiments described above will be considered. The layout for the case where the semiconductor device according to the first embodiment is employed as the semiconductor device having a representative MIM capacitance element will be described below. The same applies to the semiconductor devices shown in the second to seventh embodiments.

Figure 33:
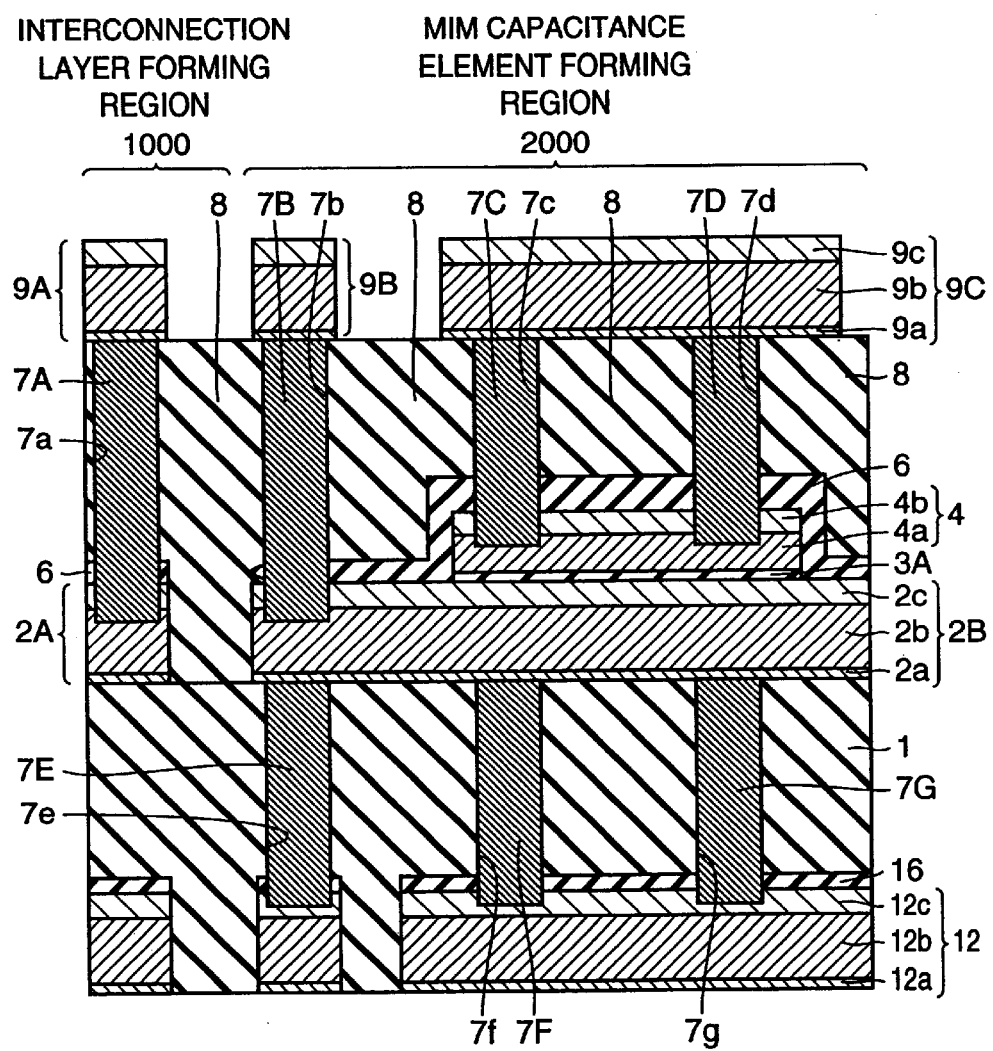
FIGS. 33 and 34 are diagrams of first and second cross sectional structures showing problems of the semiconductor device according to the first embodiment.

FIG. 33 is a diagram representing a cross sectional structure of a layout structure in the case where the semiconductor device according to the first embodiment is employed, and where no restriction is applied to the method of connecting lower metal layer 2B. Immediately beneath lower metal layer 2B, a lower interconnection layer 12 made of a TiN layer 12A, an AlCu layer 12b, and a TiN/Ti layer 12c is formed with a lower interlayer insulating film 1 disposed therebetween. Interconnection lines 7E, 7F, 7G provided in via holes 7e, 7f, 7g in lower interlayer insulating film 1 connect between lower metal layer 2B and lower interconnection layer 12.

Figure 34:
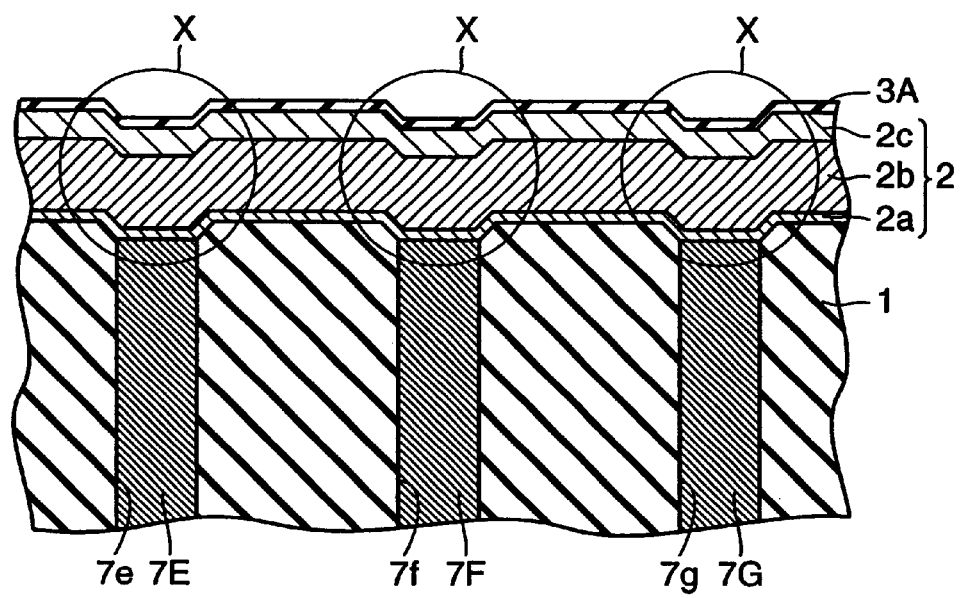

Here, since interconnection lines 7E, 7F, 7G are provided, recess portions (regions indicated by X in FIG. 34) corresponding to via holes 7e, 7f, 7g are formed in dielectric layer 3A and the lower metal layer 3B as shown in an enlarged cross sectional view of FIG. 34 so that the surface area of dielectric layer 3A may vary with respect to the design value, and the capacitance of the MIM capacitance element may disadvantageously become unstable.

Figure 35:
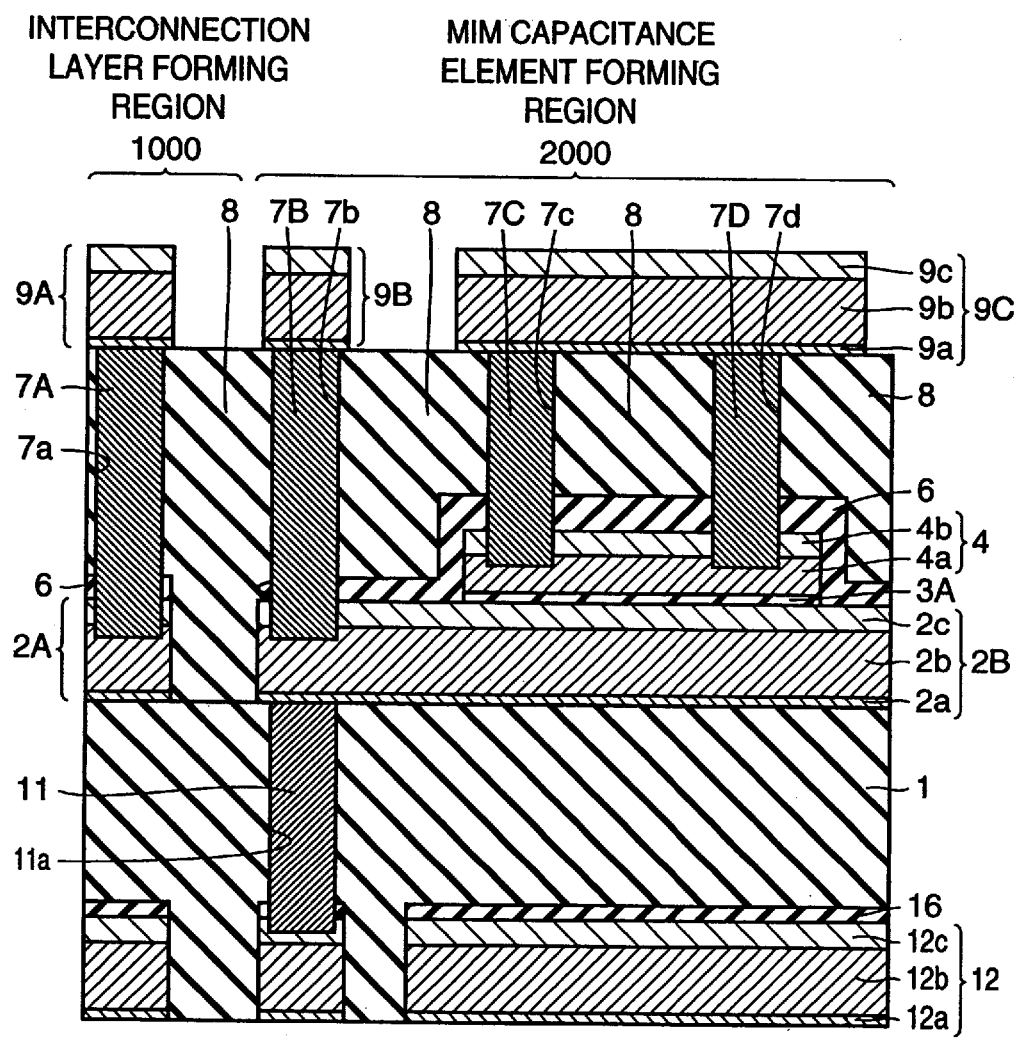
FIGS. 35 to 37 are diagrams of the cross sectional structures of the semiconductor devices according to the eighth to tenth embodiments, respectively.

Thus, according to the layout of the semiconductor device according to the eighth embodiment shown in the diagram of the cross sectional structure of FIG. 35, interconnection lines 7F, 7G are not provided below lower metal layer 2B, and only an interconnection line 11 is provided in a via hole 11a.

Function and Effect

By adopting this layout, dielectric layer 3A would not become uneven so that the surface area of dielectric layer 3A would take a value as designed, and the capacitance of the MIM capacitance element can be stabilized.

Ninth Embodiment

Figure 36:
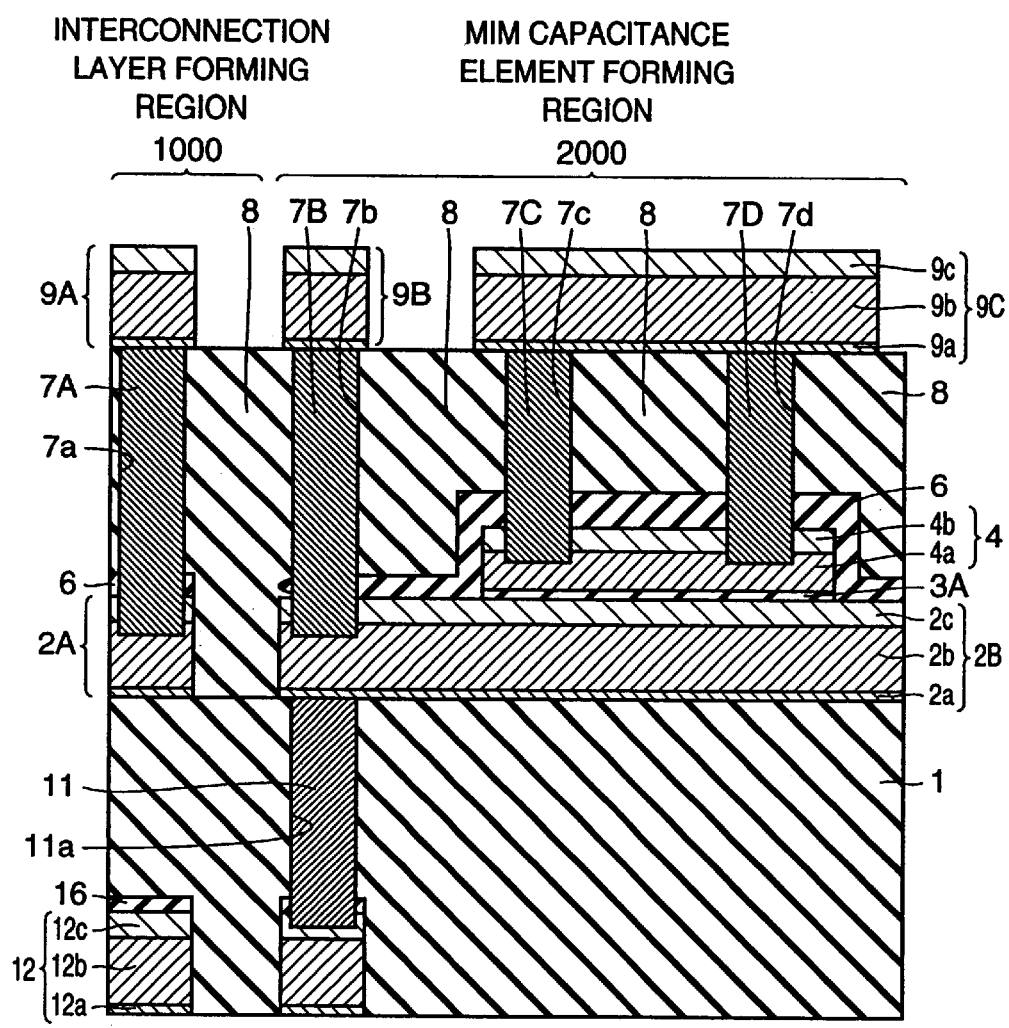

Now, the layout of the semiconductor device according to the ninth embodiment will be described. In the layout according to the eighth embodiment shown in FIG. 35, there is a possibility that parasitic capacitance between lower metal layer 2B and lower interconnection layer 12 becomes a problem. Thus, according to the ninth embodiment, as shown in the cross sectional structure of FIG. 36, lower interconnection layer 12 is not provided in a layer immediately below lower metal layer 2B forming the MIM capacitance element in order to solve this problem of parasitic capacitance. In addition, from the viewpoint of reducing the parasitic capacitance, it is also possible to adopt a structure in which the thickness of lower metal layer 2B and the thickness of lower interconnection layer 12 are increased so that the parasitic capacitance becomes at least 10% or less of the capacitance of the MIM capacitance element.

Function and Effect

By adopting this layout, reduction in the parasitic capacitance can be achieved, and the reliability of the function of the semiconductor device having the MIM capacitance element can be improved.

Tenth Embodiment

Now, a layout of the semiconductor device according to the tenth embodiment will be described. The tenth embodiment attempts to shield the devices and other interconnections disposed below a metal interconnection layer from the MIM capacitance element by disposing the metal interconnection layer such that the metal interconnection layer contain at least the MIM capacitance element when viewed in a plane.

Figure 37:
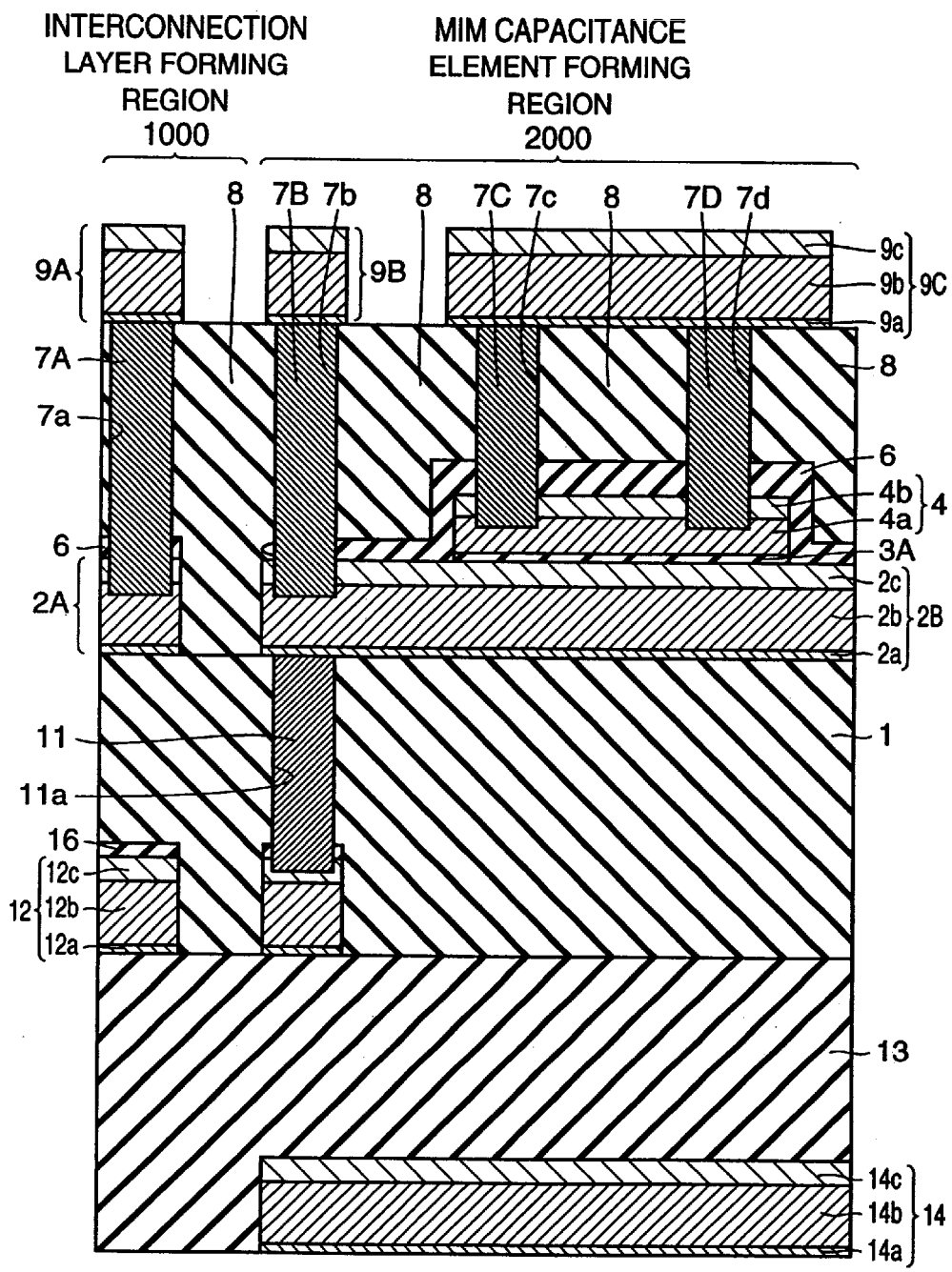

As shown in FIG. 37, the specific structure includes a lower interlayer insulating film 1 provided immediately beneath a lower metal layer 2B forming the MIM capacitance element, and further a metal interconnection layer 14 provided below lower interlayer insulating film 1 with an interlayer insulating layer 13 disposed therebetween. Metal interconnection layer 14, for instance, is formed of a TiN layer 14a, an AlCu layer 14b, a TiN/Ti layer 14c and the like. In addition, a metal interconnection layer 12 is provided within a lower interlayer insulating film 1, and metal interconnection layer 12 and lower metal layer 2B are connected by an interconnection line 11A provided within an via hole 11a in interlayer insulating film 1. Metal interconnection layer 12 is also formed of a TiN layer 12a, an AlCu layer 12b, a TiN/Ti layer 12c and the like, for instance.

Function and Effect

By adopting this layout, it becomes possible to shield with metal interconnection layer 14 the influence of the MIM capacitance element upon a device or an interconnection layer provided in the vicinity of the MIM capacitance element, and the reliability of the function of the semiconductor device having the MIM capacitance element can be improved.

Eleventh Embodiment

Now, a layout of the semiconductor device according to the eleventh embodiment will be described. While the thickness of upper metal layer 4 was set to be thinner than the thickness of lower metal layer 2B to achieve flatness of interlayer insulating film 8 (see FIG. 1) in the first embodiment described above, the eleventh embodiment attempts to achieve flatness of interlayer insulating film 8 by additionally taking into consideration a planar layout. It is theoretically recognized that interlayer insulating film 8 where the MIM capacitance element resides becomes higher than other regions when the MIM capacitance element is formed in a localized manner.

Figure 38:
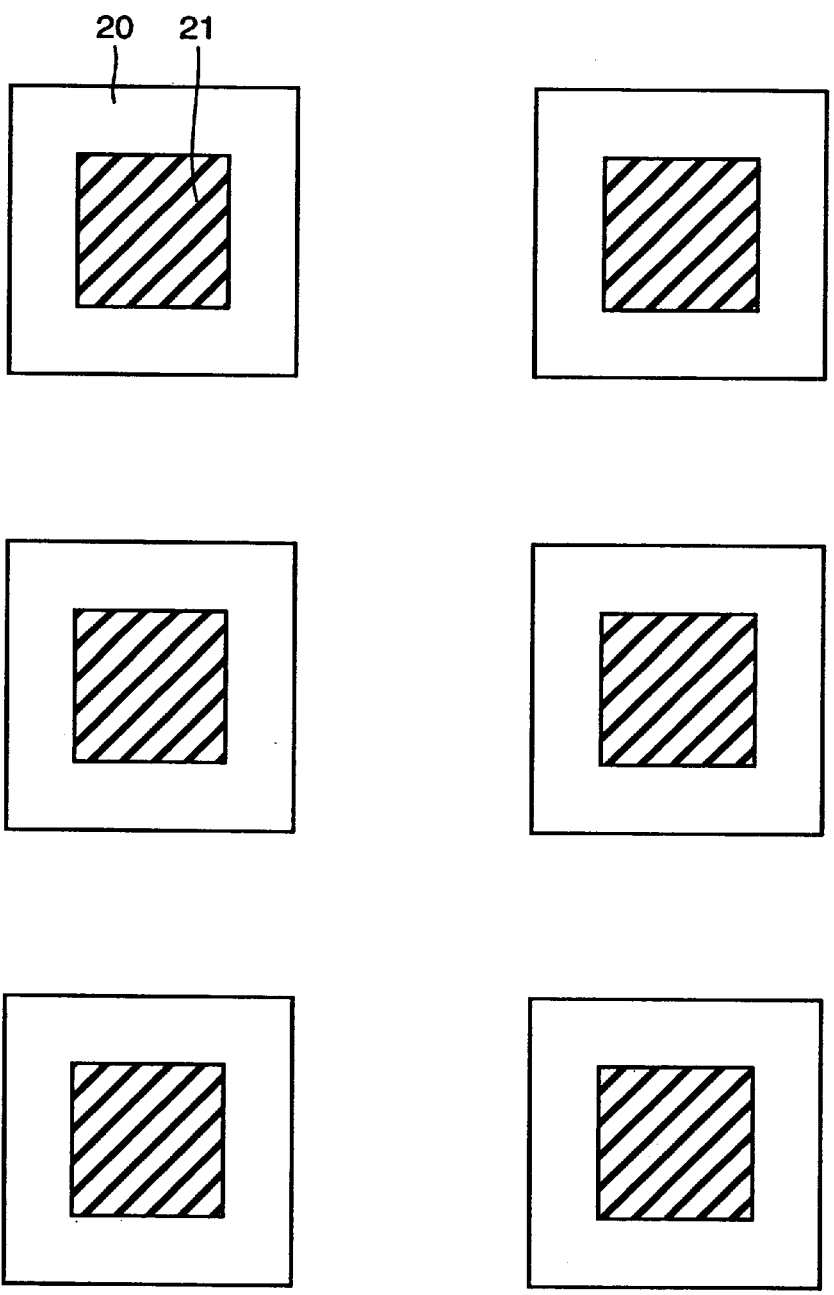
FIG. 38 is a plan view of a semiconductor device according to an eleventh embodiment.

Thus, according to the eleventh embodiment, the percentage of the area occupied by the MIM capacitance element (for instance, between 10% and 50% in the case of 300×300 mesh) is defined, and a dummy upper metal layer 21 is formed on a dummy lower metal layer 20 of a dummy MIM capacitance element as shown in FIG. 38, and the MIM capacitance element that contributes to the operation and the dummy MIM capacitance element are disposed evenly within a chip.

Function and Effect

By adopting this layout, a region of uniform height (the MIM capacitance element that actually functions and the dummy MIM capacitance element) would be formed within the chip so that it becomes possible uniformly to planarize interlayer insulating film 8 using the CMP polishing.

As described above, according to a semiconductor device and a method of manufacturing the semiconductor device based on the present invention, it becomes possible to form a lower metal layer forming a capacitance element at the same time in the step of producing a lower interconnection layer, and only a step that utilizes a sheet of mask (a photolithography step) needs to be additionally provided for separating a conductive layer into the lower interconnection layer and the lower metal layer so that there is no need to provide a separate step for forming the lower metal layer.

In addition, a step of forming a first via hole that passes through the lower metal layer and a second via hole that passes through an upper metal layer can take place at the same time as the conventional step of forming a third via hole that passes through the lower interconnection layer, while a step of forming first and second interconnection lines respectively within the first and second via holes can take place at the same time as the step of forming a third interconnection line within the third via hole so that there is no need to provide separate steps for forming the first and second via holes and the first and second interconnection lines.

Further, the thickness of the upper metal layer is formed to be thinner than the thickness of the lower metal layer so that the planarization by the CMP technique of a surface of an interlayer insulating film can be facilitated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a capacitance element formed by stacking a lower metal layer, a dielectric layer, and an upper metal layer;
   an interconnection layer provided in a prescribed region;
   a first interconnection line connected via a first via hole to said lower metal layer;
   a second interconnection line connected via a second via hole to said upper metal layer; and
   a third interconnection line connected via a third via hole to said interconnection layer, wherein
   said lower metal layer is made of a same material formed in a same manufacturing step as that of said interconnection layer,
   said first interconnection line and said second interconnection line are made of a same material formed in a same manufacturing step as that of said third interconnection line after said first via hole, said second via hole, and said third via hole are formed at the same time,
   a side surface of said upper metal layer is covered with a sidewall insulating layer that is separate from an interlayer insulating film through which said vias are formed, and
   only the side surface of said upper metal layer and only a side surface of said dielectric layer are covered by said sidewall insulating layer.

2. The semiconductor device according to claim 1, wherein a thickness of said upper metal layer is formed to be thinner than a thickness of said lower metal layer.

3. The semiconductor device according to claim 1, wherein said dielectric layer and said upper metal layer are patterned using a same mask so that they have a same shape.

* * * * *

UNITED STATES PATENT AND TRADEMARK OFFICE
CERTIFICATE OF CORRECTION

PATENT NO. : 6,657,247 B2
DATED : December 2, 2003
INVENTOR(S) : Kenji Yoshiyama et al.

It is certified that error appears in the above-identified patent and that said Letters Patent is hereby corrected as shown below:

<u>Title page,</u>
Item [73], Assignee, change the first assignee "Mitsubishi Denki Kabushiki Kaisha, Tokyo (JP)" to -- Renesas Technology Corp., Tokyo (JP) --

Signed and Sealed this

Fifth Day of April, 2005

JON W. DUDAS
*Director of the United States Patent and Trademark Office*